: US007540923B2

(12) United States Patent
Takagi et al.

(10) Patent No.: US 7,540,923 B2
(45) Date of Patent: Jun. 2, 2009

(54) SHOWER HEAD STRUCTURE FOR PROCESSING SEMICONDUCTOR

(75) Inventors: Toshio Takagi, Nirasaki (JP); Takeshi Sakuma, Minato-ku (JP); Yuji Kato, Ebina (JP); Kenji Matsumoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 306 days.

(21) Appl. No.: 10/505,169

(22) PCT Filed: Feb. 28, 2003

(86) PCT No.: PCT/JP03/02327

§ 371 (c)(1),
(2), (4) Date: Aug. 30, 2004

(87) PCT Pub. No.: WO03/073490

PCT Pub. Date: Sep. 4, 2003

(65) Prior Publication Data

US 2005/0118737 A1 Jun. 2, 2005

(30) Foreign Application Priority Data

| Feb. 28, 2002 | (JP) | ............................ 2002-054541 |
| Jun. 18, 2002 | (JP) | ............................ 2002-177192 |
| Dec. 17, 2002 | (JP) | ............................ 2002-365813 |

(51) Int. Cl.
| C23C 16/52 | (2006.01) |
| C23F 1/00 | (2006.01) |
| H01L 21/306 | (2006.01) |
| C23C 16/18 | (2006.01) |

(52) U.S. Cl. .................... 118/666; 116/667; 156/345.24
(58) Field of Classification Search ................. 118/715, 118/666, 667; 156/345.24
See application file for complete search history.

(56) References Cited

U.S. PATENT DOCUMENTS

| 5,536,359 | A | * | 7/1996 | Kawada et al. ................. 438/16 |
| 5,846,883 | A | * | 12/1998 | Moslehi ....................... 438/711 |
| 6,758,941 | B1 | * | 7/2004 | Ookawa et al. ......... 156/345.47 |
| 2004/0020599 | A1 | * | 2/2004 | Tanaka et al. .......... 156/345.29 |

FOREIGN PATENT DOCUMENTS

| JP | 06204143 A | * | 7/1994 |
| JP | 7-134069 | | 5/1995 |

* cited by examiner

Primary Examiner—Rudy Zervigon
(74) Attorney, Agent, or Firm—Oblon, Spivak, McClelland, Maier & Neustadt, P.C.

(57) ABSTRACT

A shower head structure disposed in a device 2 for processing a semiconductor while supplying processing gas to a processing space S for storing a heated processed substrate W, comprising a shower head 12 having a plurality of gas injection holes 20B for supplying the processing gas and a light introducing rod 68 of a radiation thermometer 66 inserted into at least one of the gas injection holes 20B.

11 Claims, 15 Drawing Sheets

FIG. 11A
FIG. 11B
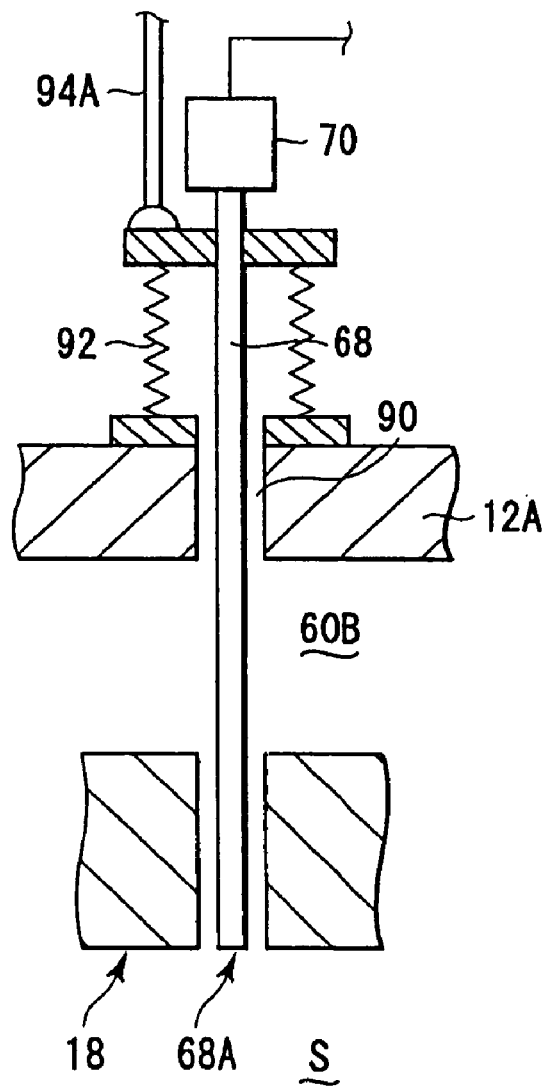
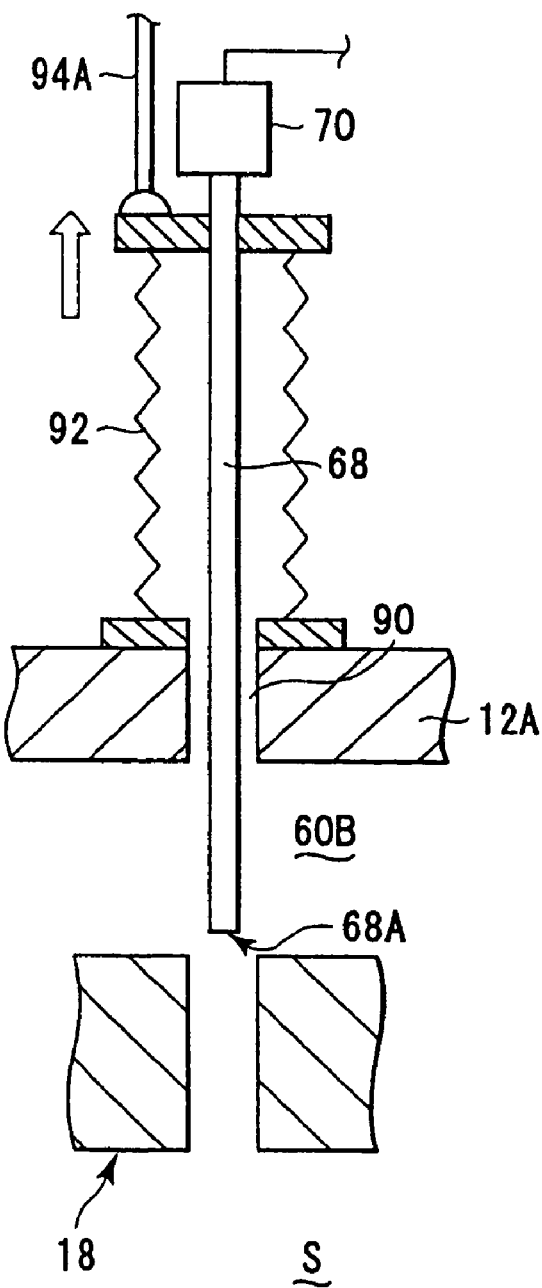

|   | THERMOCOUPLE (°C) | RADIATION THERMOMETER(°C) | TEMPERATURE DIFFERENCE(°C) |
|---|---|---|---|
| 1 | 433.0 | 435 | +2.0 |
| 2 | 432.8 | 434.7 | +1.9 |
| 3 | 432.8 | 434.5 | +1.7 |
| 4 | 433.0 | 434.7 | +1.7 |
| 5 | 432.9 | 434.6 | +1.7 |
| 6 | 432.9 | 434.6 | +1.7 |
| 7 | 432.8 | 434.6 | +1.8 |
| 8 | 432.8 | 434.6 | +1.8 |

SHOWER HEAD STRUCTURE FOR PROCESSING SEMICONDUCTOR

FIELD OF THE INVENTION

The present invention relates to a shower head structure for semiconductor processing and a semiconductor processing device and method to execute processes of forming a metal oxide film, etching, and the like. The term semiconductor processing used herein denotes various processes executed so as to manufacture on a substrate a structure including semiconductor devices, and wiring and electrodes connected thereto by forming semiconductor layers, insulating layers, electrically conductive layers, and the like, on the substrate such as a semiconductor wafer and a LCD substrate.

BACKGROUND OF THE INVENTION

In case of manufacturing a semiconductor device, a film forming processing and a pattern etching processing are repeatedly carried out with respect to a semiconductor wafer. Specifications of the film forming processing become stricter every year as the semiconductor device becomes of a higher density and higher integrity. For example, such a very thin oxide film as an insulating film of a capacitor and a gate insulating film is required to be even thinner but with a high insulative property.

A silicon oxide film and a silicon nitride film have been conventionally used as such an insulating film. However, recently, there is a growing tendency of using a metal oxide film, e.g., a tantalum oxide ($Ta_2O_5$) film, as a material having more satisfactory insulative property (see, e.g., Japanese Patent Laid-Open Publication No. 1990-283022). Such a metal oxide film, even when it's thin, exhibits a greatly reliable insulative property. In order to form the metal oxide film having satisfactory properties, it is required to control the temperature of the semiconductor wafer accurately during the film forming processing.

Such a metal oxide film may be deposited by way of MOCVD (metal-organic chemical vapor deposition), i.e., by using a gasified organometallic compound. In case of forming a tantalum oxide film by MOCVD, a metal alkoxide of tantalum, e.g., $Ta(OC_2H_5)_5$ (pentaethoxytantalum: PET), is used as a liquid source. The liquid source is vaporized by bubbling a nitrogen gas therethrough or by a vaporizer in which a vaporization temperature is maintained, and then is transported as gas phase species to a processing chamber kept under vacuum. At the same time, an oxidizing gas such as oxygen gas is provided into the processing chamber as well. The supplied source provides a film forming material as it is decomposed on a surface of the semiconductor wafer heated to a processing temperature of, e.g., about 450° C. The tantalum oxide ($Ta_2O_5$) film is deposited on the surface of the wafer by the film forming material.

In a conventional single wafer thermal treatment device for semiconductors processing, a thermocouple serving as a temperature detection means is installed at a susceptor where a wafer is mounted in order to control the processing temperature. The wafer temperature is detected indirectly by the thermocouple. Based on the detected temperature, an output of a heating means such as a heating lamp or a heater is controlled and thus the wafer temperature is controlled. As mentioned above, such a thermocouple directly detects the susceptor temperature to thereby indirectly detect the wafer temperature thereon. Hence, there inevitably occurs a certain difference between the actual wafer temperature and the detected temperature.

Instead of employing the thermocouple, there has been proposed another scheme wherein the wafer temperature is detected by using a radiation thermometer which detects temperature of an object based on a radiation intensity of a specific wavelength band of the object to be measured [see Japanese Patent Laid-Open Publication No. 1996-264472 (pages 4 to 5 and FIGS. 1 and 2) and Japanese Patent Laid-Open Publication No. 1999-45859 (page 4 and FIG. 1)]. By way of using the radiation thermometer, the wafer temperature can be detected directly and accurately in a contactless manner.

In case of using the radiation thermometer, if an extra thin film deposited on an incident plane of a light probe for collecting light emitted from the wafer, the wafer temperature cannot be measured accurately because the thin film absorbs the light. During the process of forming a film on the wafer, therefore, it is required to prevent the thin film from adhering to the incident plane of the light probe exposed to a processing space, or a transparent glass substrate or the like dividing the incident plane from the processing space.

However, if a certain gas is provided to the incident plane, the transparent glass substrate, or the like for the sole purpose of preventing adhesion of the extra thin film, a partial pressure of a source gas (for example, pentaethoxytantalum) required for forming the metal oxide film becomes lowered due to the extra gas. As a result, a thickness of the film where the certain gas is provided is changed and the uniformity of film thickness over the wafer surface is deteriorated.

Furthermore, in case of the processing device using the heating lamp, a certain part of heat rays originated from the heating lamp may undergo scattered reflection in the processing space to finally get into the radiation thermometer. In this case, the wafer temperature cannot be measured accurately.

SUMMARY OF THE INVENTION

It is, therefore, a primary object of the present invention to provide a shower head structure and a semiconductor processing device and method that can improve an intra-surface uniformity in the processing of semiconductor even when a radiation thermometer being used.

It is, therefore, another object of the present invention to provide the semiconductor processing device that can measure a temperature of a substrate to be processed with a satisfactory accuracy without being affected by scattered reflection of heat rays emanating from a heating lamp.

In accordance with a first aspect of the present invention, there is provided a shower head structure for use in a device for processing a semiconductor while a processing gas being provided into a processing space accommodating a heated substrate to be processed, including: a shower head including a plurality of gas injection holes for providing the processing gas; and at least one light introducing rod of a radiation thermometer inserted through at least one of the gas injection holes.

In accordance with a second aspect of the present invention, there is provided a semiconductor processing device for processing a semiconductor while a processing gas being provided into a processing space accommodating a heated substrate to be processed, including: a processing chamber forming the processing space and capable of being pumped in vacuum; a susceptor for mounting the substrate in the processing chamber; a heater for heating the substrate on the susceptor; a shower head provided with a plurality of gas injection holes for supplying the processing gas; at least one light introducing rod of a radiation thermometer inserted through at least one of the gas injection holes; and a temperature controller for controlling the heater based on a detected value of the radiation thermometer.

In accordance with a third aspect of the present invention, there is provided a semiconductor processing device for processing a semiconductor while a processing gas being provided into a processing space accommodating a heated substrate to be processed, including: a processing chamber forming the processing space and capable of being pumped in vacuum; a susceptor for mounting the substrate in the processing chamber; a heater for heating the substrate on the susceptor; a temperature measuring device installed at the susceptor; a shower head provided with a plurality of gas injection holes for supplying the processing gas; at least one light introducing rod of a radiation thermometer inserted through at least one of the gas injection holes; a temperature controller for controlling the heater based on a detected value of the radiation thermometer; and a temperature compensator for correcting a setting temperature value of the susceptor for the temperature controller based on a detection value of the radiation thermometer and a target temperature value of the substrate, when the detection value and the target temperature value are obtained by performing dummy process by way of using a dummy substrate for correcting temperature.

In accordance with a fourth aspect of the present invention, there is provided a semiconductor processing device for processing a semiconductor while providing a processing gas into a processing space accommodating a heated substrate to be processed, including: a processing chamber forming the processing space and capable of being pumped in vacuum; a susceptor for mounting the substrate in the processing chamber; a heater including a heating lamp, installed below the susceptor, for heating the substrate on the susceptor; a support member having a ring shape for supporting the susceptor by contacting a peripheral part thereof, wherein the support member has a low thermal conductivity and is colored for blocking heat rays emitted from the heating lamp; a shower head, installed at a ceiling of the processing chamber, for supplying the processing gas; a radiation thermometer attached to an upper part of the shower head; and a temperature controller for controlling the heater based on a detected value of the radiation thermometer.

In accordance with a fifth aspect of the present invention, there is provided a semiconductor processing device for processing a semiconductor while providing a processing gas into a processing space accommodating a heated substrate to be processed, including: a processing chamber forming the processing space and capable of being pumped in vacuum; a susceptor for mounting the substrate in the processing chamber; a heater for heating the substrate on the susceptor; a shower head, installed at a ceiling of the processing chamber, for providing the processing gas; a heat ray introducing passage vertically formed through the shower head; a radiation thermometer facing through a measurement window at an upper opening part of the heat ray introducing passage; and an inert gas introducing passage for introducing an inert gas into the heat ray introducing passage.

In the device of the fifth aspect, it may be possible that the inert gas is discharged from a lower end opening of the heat ray introducing passage to be diffused while the gas is falling toward outside of the susceptor; and the heat ray introducing passage is spaced apart from a center of the shower head such that a position of a main gas stream of the inert gas discharged therefrom falls outside an outer circumference of the substrate on the susceptor when the gas stream reaches an identical horizontal level to that of an upper surface of the susceptor.

In accordance with a sixth aspect of the present invention, there is provided a method for performing semiconductor processing while providing a processing gas into a processing space accommodating a heated substrate to be processed, including the steps of: heating, by using a heater, the substrate in a processing chamber forming the processing space and capable of being pumped in vacuum; performing the semiconductor processing by providing the processing gas from a plurality of gas injection holes of a shower head toward the substrate heated by the heater; and while performing the semiconductor processing, controlling the heater based on a detected value of a radiation thermometer having at least one light introducing rod inserted through at least one of the gas injection holes.

In accordance with a seventh aspect of the present invention, there is provided a method for performing semiconductor processing while providing a processing gas into a processing space accommodating a heated substrate to be processed, including the steps of: heating, by using a heater, the substrate on a susceptor installed in a processing chamber forming the processing space and capable of being pumped in vacuum; performing the semiconductor processing by providing the processing gas from a plurality of gas injection holes of a shower head toward the substrate heated by the heater; while performing the semiconductor processing, controlling the heater based on a detected value of a temperature measuring device installed at the susceptor; executing dummy processing by heating a dummy substrate for temperature correction placed on the susceptor by the heater; while, performing the dummy processing, monitoring the temperature of the dummy substrate by using a radiation thermometer having at least one light introducing rod inserted through at least one of the gas injection holes; and correcting a setting temperature of the susceptor based on a detected value of the radiation thermometer and a target temperature value of the substrate.

BRIEF DESCRIPTION OF THE DRAWINGS

FIGS. 11A and 11B are enlarged partial views, respectively, showing a movement of a light introducing rod in the device shown in FIG. 10;

DETAILED DESCRIPTION OF THE PREFERRED EMBODIMENTS

Figure 1:
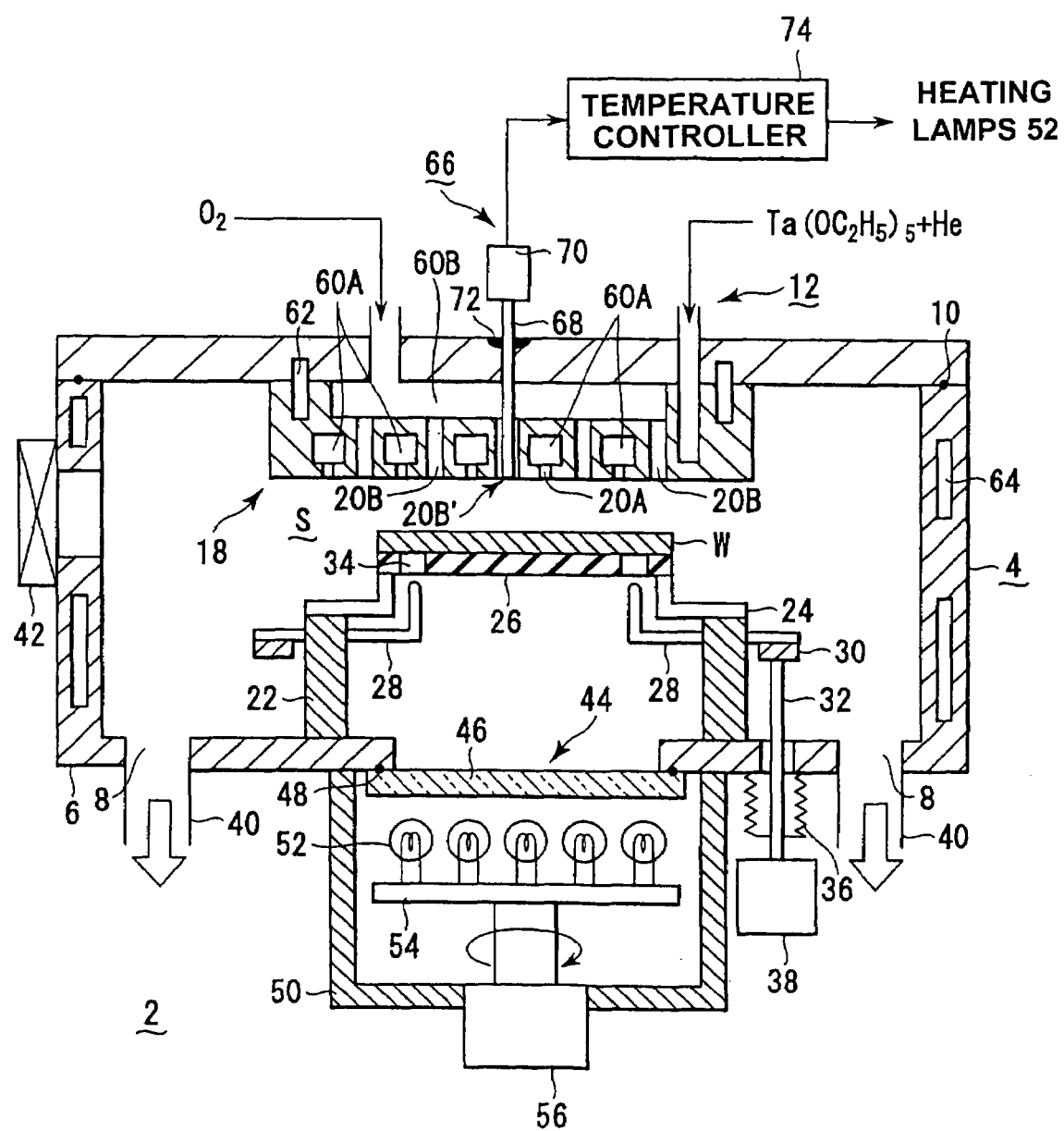
FIG. 1 presents a structural diagram of a semiconductor processing device incorporating therein a shower head structure in accordance with a preferred embodiment of the present invention.

Preferred embodiments in accordance with the present invention will now be described with reference to the accompanying drawings. Parts having substantially same functions and same structures will be designated with like reference numerals, and a description thereof will be repeated only when necessary.

FIG. 1 presents a structural diagram showing a semiconductor processing device including a shower head structure in accordance with a preferred embodiment of the present invention. In this embodiment, a semiconductor processing will be exemplified by a case where a tantalum oxide film, i.e., a metal oxide film, is formed by CVD.

As shown in FIG. 1, a processing device 2 includes a processing chamber 4 formed in a shape of a cylinder, e.g., by using aluminum. Exhaust ports 8 are arranged at a bottom portion 6 of the processing chamber 4, which enables vacuum pumping in the processing chamber. A shower head 12 is installed at a ceiling of the processing chamber 4 through a seal member 10, e.g., an O ring. In a gas injection surface 18 at a lower side of the shower head 12, a plurality of gas injection holes 20A and 20B is provided. Through the gas injection holes 20A and 20B, various processing gases are injected into a processing space S.

In the processing chamber 4, a susceptor 26 facing toward the shower head 12 is installed so as to mount thereon a semiconductor wafer W, i.e., a substrate to be processed. The susceptor 26 is supported by a cylindrical reflector 22 built on the bottom portion 6 of the processing chamber 4, e.g., through three L-shaped support members 24 (only two are depicted in FIG. 1).

Under the susceptor 26, a plurality of, e.g., three L-shaped lifter pins 28 (only two are described in the illustrated embodiment) are disposed in a manner of pointing upwards. Base parts of the lifter pins 28 are coupled in common to a ring member 30 by passing through vertically elongated insertion through-holes (not shown) and formed in the reflector 22. A push up bar lifter 32, penetrating the bottom portion 6 of the processing chamber 4, is secured to the ring member 30. At a part of the push up bar lifter 32 passing through the bottom portion 6 of the processing chamber 4, an expansible and contractible bellows 36 is interposed for maintaining airtight conditions in the processing chamber 4. A lower end portion of the push up bar lifter 32 is connected to an actuator 38. As the push up bar lifter 32 moves up and down by the actuator 38, the lifter pins 28 are selectively projected through through-holes 34 thereof above the susceptor 26, so that the wafer W is raised and lowered.

The exhaust ports 8, connected to a vacuum pump (not shown) through exhaust passages 40, are provided at a peripheral part of the bottom portion of the processing chamber 4. By using the vacuum pump, an interior of the processing chamber 4 can be evacuated to a certain vacuum level. Further, a gate valve 42, being opened and closed when the wafer is carried in and out, is installed on a side wall of the processing chamber 4.

At the bottom portion 6 of the processing chamber 4, directly below the susceptor 26, a bottom opening portion 44 having a large diameter is provided. At the bottom opening portion 44, a transparent window 46 formed of a material through which heat rays can penetrate, e.g., quartz, is attached airtightly through a seal member 48, e.g., an O ring. Under the transparent window 46, a heating chamber 50 of a box shape is installed to surround the transparent window 46. In the heating chamber 50, e.g., a number of heating lamps 52 serving as a heating means are mounted on a rotatable table 54, which also functions as a reflector. The rotatable table 54 is rotated by a rotating motor 56, which is mounted at a bottom portion of the heating chamber 50, through a rotating axis. Heat rays radiated from the heating lamps 52 are illuminated on a lower surface of the thin susceptor 26 through the transparent window 46 to heat the susceptor 26, so that the wafer W on the susceptor 26 is heated indirectly. Herein, a resistance heating source may be employed in exchange for the heating lamps 52.

Figure 2:
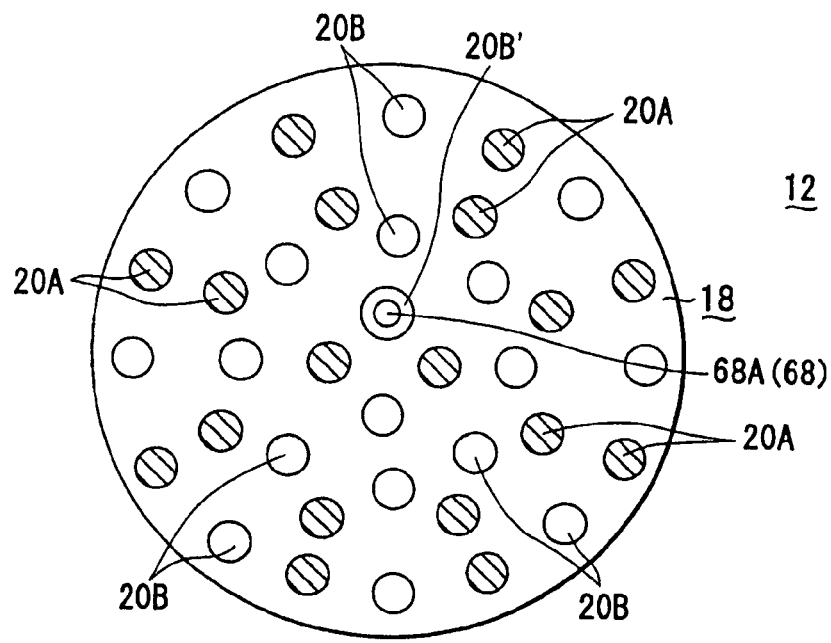
FIG. 2 illustrates a schematic view describing a gas injection surface of the shower head structure shown in FIG. 1.
Figure 3:
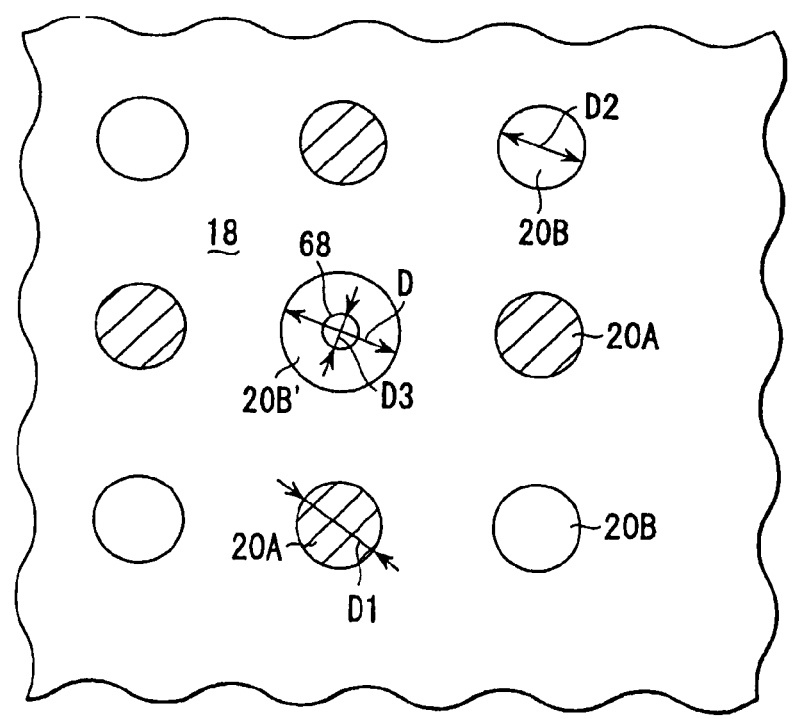
FIG. 3 exhibits an enlarged view illustrating a part of the gas injection surface shown in FIG. 2.
Figure 4:
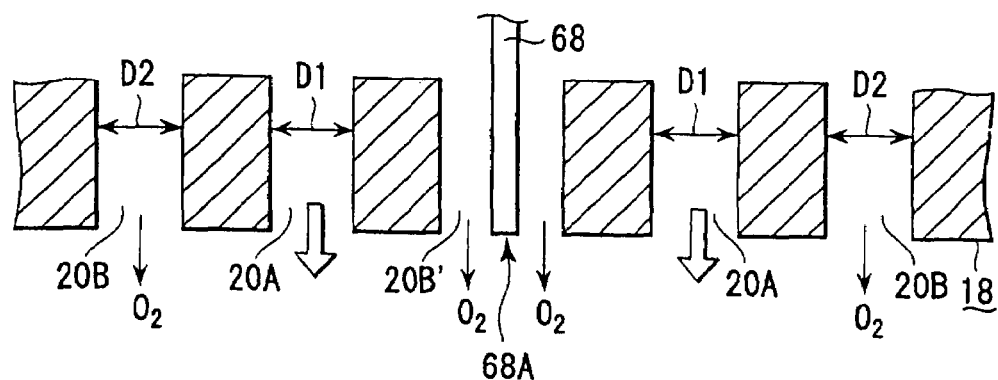
FIG. 4 provides an enlarged cross sectional view illustrating a part of the shower head structure shown in FIG. 1.

The shower head 12 installed at the ceiling of the processing chamber 4 has a same structure as that of Japanese Patent Laid-Open Publication No. 1998-79377 (U.S. Pat. No. 6,143, 081). FIG. 2 illustrates a schematic view of the gas injection surface of the shower head 12. FIG. 3 exhibits an enlarged view illustrating a part of the gas injection surface shown in FIG. 2. FIG. 4 provides an enlarged cross sectional view illustrating a part of a structure including the shower head 12.

The shower head 12 is installed in such a manner that it faces toward an upper surface of the susceptor 26 to cover an approximately entire upper surface. The processing space S is formed between the shower head 12 and the susceptor 26. The shower head 12 injects in a shower-like fashion a processing gas including, e.g., a source gas for forming a film and an oxygen gas into the processing chamber 4. In the gas injection surface 18 at a lower side of the shower head 12, plural gas injection holes 20A and 20B are formed for injecting the gas in a manner described above.

Inside the shower head 12, there are two divided spaces, i.e., a head space for source gas 60A and a head space for assist gas 60B. The source gas, e.g., a vaporized source of metal oxide materials such as a metal alkoxide [$Ta(OC_2H_5)_5$: pentaethoxytantalum] vaporized by a carrier gas, e.g., an inert gas such as helium, is introduced into the head space for source gas 60A, while a flow rate thereof being controlled. Further, an assist gas, which is oxygen serving as an oxidizing gas in this embodiment, for executing a film forming reaction is introduced into the head space for assist gas 60B, while a flow rate thereof being controlled.

The gas injection holes 20A and 20B are categorized into two groups, i.e., the source gas injection holes 20A connected to the head space for source gas 60A and the assist gas injection holes 20B communicating with the head space for assist gas 60B. During the film forming processing, the source gas and the assist gas of oxygen spouting from both the gas injection holes 20A and 20B are mixed with each other in the processing space S and then supplied as post-mix. In order to distinguish between the gas injection holes 20A and 20B, the source gas injection holes 20A are indicated as circles with dashed lines and the assist gas injection holes 20B are indicated as blank circles in FIGS. 2 and 3.

A heater 62 is installed on a side wall of the shower head 12 so as to heat a side surface thereof. A heater 64 is also installed on a side wall of the processing chamber 4 so as to heat an inner surface thereof. By using the heaters 62 and 64, the side surface of the shower head 12 and the inner surface of the processing chamber 4 are maintained at such a temperature, e.g., ranging from 140° C. to 180° C., that the source gas does not become condensed and decomposed.

In the shower head 12, a radiation thermometer 66 is arranged. Specifically, the radiation thermometer 66 includes a light introducing rod 68 for collecting light emitted from the semiconductor wafer and a temperature detector 70 for determining the wafer temperature based on the light luminance collected by the light introducing rod 68. The light introducing rod 68 having a thin rod shape is formed of, e.g., quartz, sapphire or the like and is linearly extended downwards through the ceiling of the shower head 12. The portion of the ceiling through which the light introducing rod 68 passes is kept airtight through a seal member 72, e.g., O ring.

As shown in FIGS. 1 and 4, a lower part of the light introducing rod 68 is inserted through an assist gas injection hole 20B', which is the one situated substantially at a center among the assist gas injection holes 20B formed in the gas injection surface 18. A leading end of the rod is set to be placed at about a same horizontal level as that of an open edge of the assist gas injection holes 20B. Because $O_2$ gas is injected from the assist gas injection hole 20B' during the film forming processing, an extra thin film is prevented from adhering to a light incoming surface 68A, i.e., the leading end of the light introducing rod 68.

The light introducing rod 68 collects the light in a range of angle up to about 45° C. from the leading end of the light introducing rod 68. Thanks to such a range of angle, the temperature detector 70 and the light introducing rod 68 may have a certain degree of freedom in their installation locations.

Moreover, the light introducing rod 68 may be made of a flexible material such as an optical fiber. In this case, the light introducing rod 68 can freely move in the shower head 12 and, therefore, the temperature detector 70 can also have a certain degree of freedom in its installation location.

In the gas injection surface 18, the source gas injection holes 20A and the assist gas injection holes 20B (including 20B') are properly distributed in order that a thin film is deposited on the surface of the wafer W to have a thickness of a high intra-surface uniformity. The light introducing rod 68 is inserted through one assist gas injection hole 20B' thereamong. A film can thus be prevented from adhering to the light introducing rod 68.

In this case, however, if turbulences of a gas flow rate and a gas partial pressure occur directly below the assist gas injection hole 20B' through which the light introducing rod 68 is inserted, the uniformity in the thickness of the film is deteriorated because the turbulences influence the film thickness on a part of the wafer surface therearound. Hence, it is preferable that an opening area (S) of the assist gas injection hole 20B' is set to be larger than an opening area (S1) of an assist gas injection holes 20B, as much as an area (S2) corresponding to a cross sectional area (S2) of the light introducing rod 68.

In other words, a gas injection area of the assist gas injection hole 20B' through which the light introducing rod 68 is placed is determined by subtracting the cross sectional area (S2) of the light introducing rod 68 from the opening area (S). Therefore, it is preferable that the gas injection area of the hole 20B' is set to be approximately identical to the opening area (S1), i.e., the gas injection area of a assist gas injection hole 20B. With such a configuration, adverse effects on the distribution of the amount of injected assist gas can be avoided, even though the light introducing rod 68 is installed in the assist gas injection hole 20B'.

To put it in detail, a diameter D1 of the source gas injection holes 20A is, e.g., about 2.5 mm, although it may vary depending on gas species. A diameter D2 of the assist gas injection holes 20B is generally about 1 mm for example. A diameter D3 of the light introducing rod 68 is, e.g., about 1.2 mm. Thus, a diameter D of the assist gas injection hole 20B' through which the light introducing rod 68 is placed is, e.g., about 1.56 mm. That is, when boring the assist gas injection holes 20B by using a drill, the assist gas injection hole 20B' is processed such that its diameter is slightly larger than the others.

Returning to FIG. 1, an output of the temperature detector 70 is inputted to a temperature controller 74 implemented by, e.g., a microcomputer. The temperature controller 74 controls the wafer temperature by controlling an output of the heating lamps 52, based on detected values of the temperature detector 70.

Hereinafter, an exemplary method for processing semiconductor by using the device shown in FIG. 1 will be described.

First, a semiconductor wafer W to be processed is carried into the processing chamber 4 kept under vacuum from a transfer chamber and a load-lock chamber (not shown) through an opened gate valve. And then the wafer W is mounted on the susceptor 26 by moving the lifter pins 28 up and down.

Thereafter, while vacuum pumping and maintaining a predetermined process pressure in the processing chamber 4, the semiconductor wafer W is heated by the heating lamps 52, so that a temperature thereof reaches a predetermined level and then is maintained thereat. Under such a condition, the source gas and the $O_2$ gas are provided from the shower head 12 to the processing space S and thus a process of forming the metal oxide film is executed.

The liquid source $Ta(OC_2H_5)_5$ is vaporized by the He gas in the vaporizer and then is provided as the source gas. And a gas supply system therefore is preheated to a predetermined temperature, e.g., about 160° C., so as to prevent the source gas from being liquefied again. The source gas, introduced into the head space for source gas 60A of the shower head 12, is provided to the processing space S through the source gas injection holes 20A disposed at the gas injection surface 18. On the other hand, the $O_2$ gas, provided into the head space for assist gas 60B of the shower head 12, is supplied to the processing space S through the assist gas injection holes 20B and 20B' disposed at the gas injection surface 18.

In this way, the source gas and the $O_2$ gas injected into the processing space S are mixed and react to provide the film forming material. The film forming material is deposited on the wafer surface to form a film of tantalum oxide film ($Ta_2O_5$). In this case, the wafer temperature ranges from 400° C. to 500° C., e.g., about 480° C., and a surface temperature of the shower head 12 is, e.g., about 150° C.

Light emitted from the surface of the wafer W is collected by the light introducing rod 68 of the radiation thermometer 66 installed in the assist gas injection hole 20B' arranged at the substantially central part of the gas injection surface 18. The surface temperature of the wafer W is determined by the temperature detector 70 based on the collected light. The wafer temperature detected by the radiation thermometer 66 is inputted to the temperature controller 74. Then, based on the inputted wafer temperature, the output of the heating lamps 52 is controlled by the temperature controller 74 such that the wafer temperature is maintained at a predetermined level.

If an unwanted thin film adheres to the light incoming surface 68A of the leading end of the light introducing rod 68, a part of light incident upon the light introducing rod 68 can be absorbed by the thin film, so that the detected value of the wafer temperature may become inaccurate. In accordance with this embodiment, however, the unwanted thin film is prevented from adhering on the light incoming surface 68A since the $O_2$ assist gas is injected from the assist gas injection hole 20B' through which the light introducing rod 68 is placed. Accordingly, the wafer temperature can be detected almost accurately and thus the wafer temperature can be controlled precisely.

Moreover, it is not necessary to either form an additional attaching hole for the light introducing rod 68 or use an extra gas for preventing the adhesion of thin film. In other words, the light introducing rod 68 is inserted through the assist gas injection hole 20B' that provides the assist gas required to form the film, and an unwanted thin film is prevented from being adhered to the light incoming surface 68A by the assist gas. Therefore, while avoiding adverse effects on the partial pressure of the source gas around the region directly below the location where the light introducing rod 68 is installed, the intra-surface processing uniformity, i.e., the intra-surface uniformity of film thickness in this embodiment, is maintained.

Furthermore, the gas injection area of the assist gas injection hole 20B' [=the opening area (S)–the cross sectional area (S2) of the light introducing rod 68] is set to be approximately identical to the opening area (S1) (=the gas injection area) of one assist gas injection hole 20B. Therefore, the distribution in the amount of injected $O_2$ gas is not affected adversely and thus, it becomes possible to further improve the intra-surface uniformity of the film thickness.

Alternatively, it may be considered to place the light introducing rod 68 through one of the source gas injection holes 20A instead of the assist gas injection hole 20B'. However, this is not preferable because a constituent of the source gas adheres to a surface including the light incoming surface 68A of the light introducing rod 68 to form thereon a thin film. And, an inert gas may be configured to be injected into the injection hole through which the light introducing rod 68 is placed in order that the intra-surface uniformity of the film thickness is not deteriorated.

Figure 5:
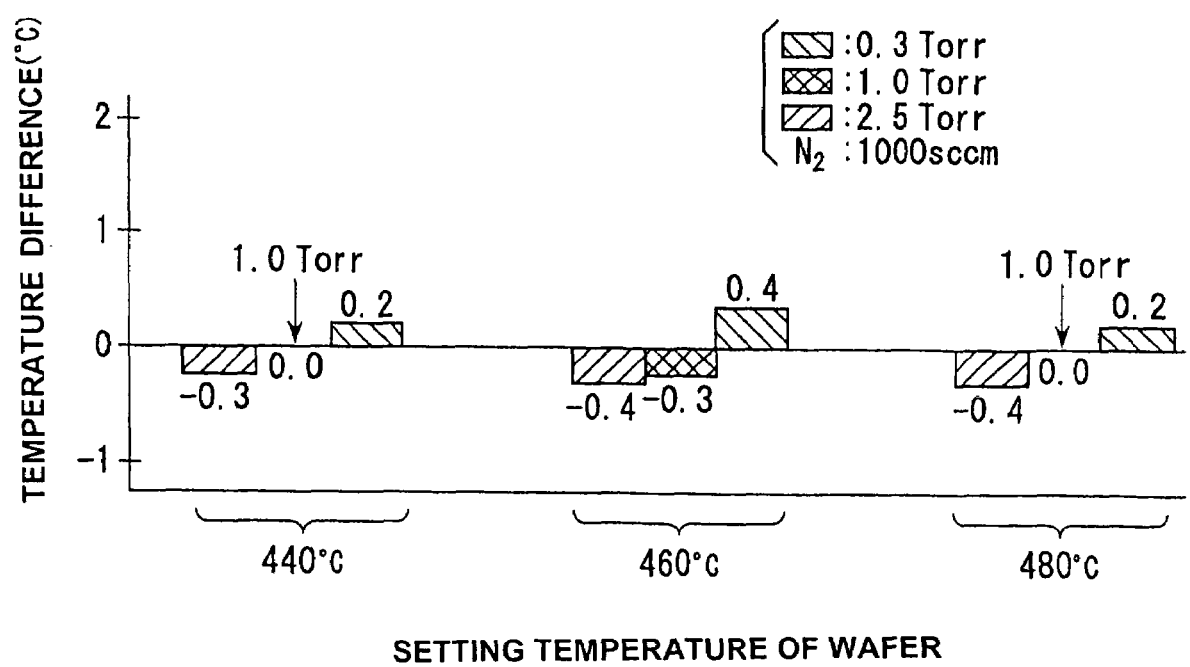
FIG. 5 charts a graph representing differences between measured temperatures of a thermocouple (mounted on a wafer) and those of a radiation thermometer (values of the radiation thermometer–values of the thermocouple) before performing a film forming processing.
Figure 6:
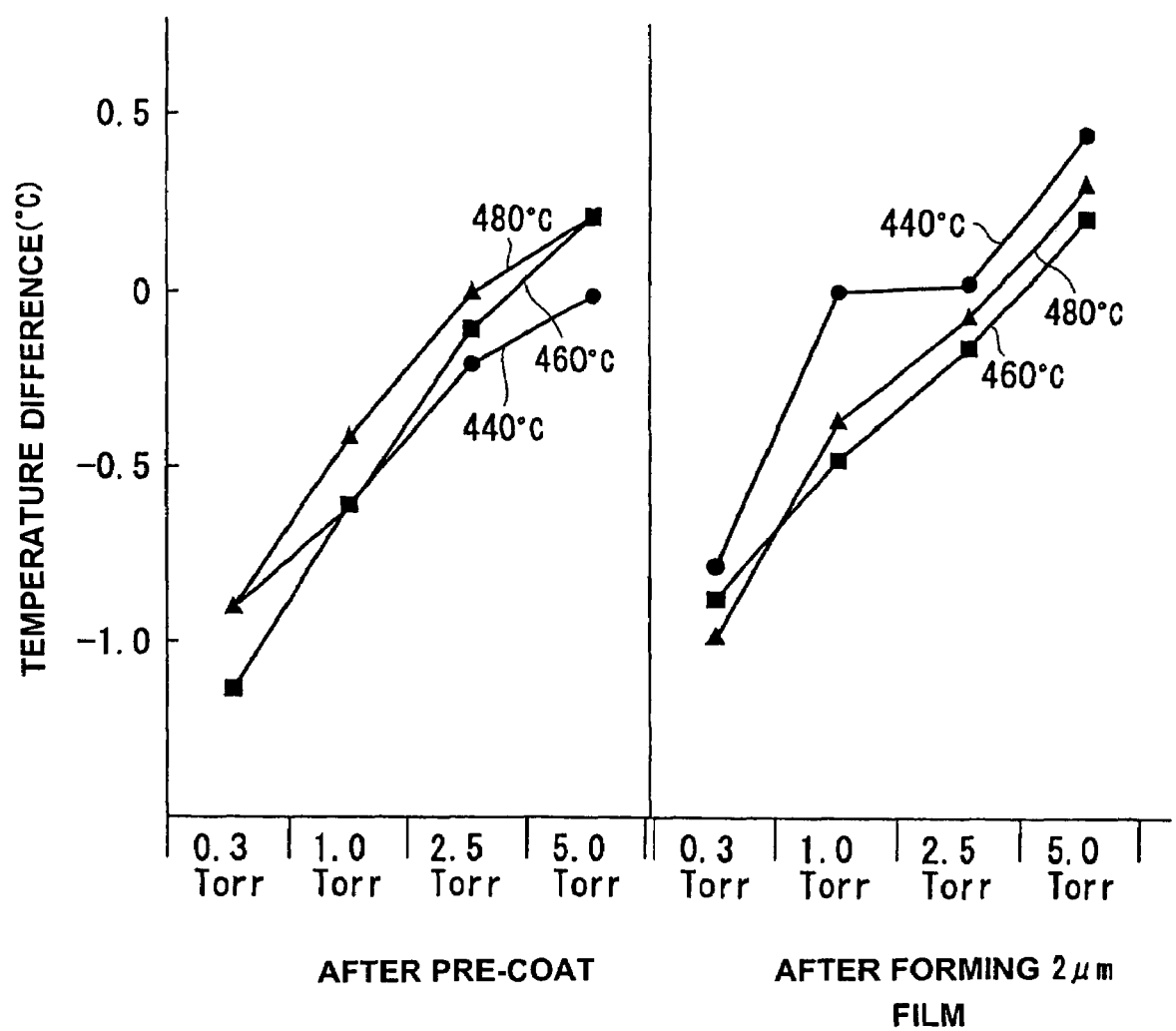
FIG. 6 shows graphs representing the variation of differences between temperatures measured by a thermocouple (mounted on a wafer) and temperatures measured by a radiation thermometer (values of the radiation thermometer–values of the thermocouple) before and after executing a film forming processing.

In the following, results of experiments will be described, which were carried out to evaluate whether the radiation thermometer 66 attached to the shower head 12 can properly detect the wafer temperature with high accuracy. FIG. 5 is a graph representing differences between measured temperatures of a thermocouple (mounted on the wafer) and those of a radiation thermometer (values of the radiation thermometer–values of the thermocouple) before performing a film forming processing. FIG. 6 shows graphs representing the variation of differences between temperatures measured by the thermocouple (mounted on the wafer) and temperatures measured by the radiation thermometer (values of the radiation thermometer–values of the thermocouple) before and after executing the film forming processing.

In the experiment for the experimental results shown in FIG. 5, process temperatures were 440° C., 460° C. and 480° C. With respect to each of the process temperatures, process pressures were set as 0.3 torr (40 Pa), 1.2 torr (160 Pa) and 2.5 torr (333 Pa). 1000 sccm of $N_2$ gas was provided as the assist gas. Further, the actual wafer temperature was measured by directly attaching the thermocouple to the wafer.

As shown in FIG. 5, with respect to each of the process temperatures ranging from 440° C. to 480° C., the temperature differences between the values measured by the radiation thermometer and the thermocouple showed a satisfactory result ranging from −0.4° C. to +0.4° C., i.e., within the range of ±0.5° C. Therefore, it was confirmed that the radiation thermometer could measure the wafer temperature accurately.

In the experiment for the experimental results shown in FIG. 6, the actual variation of the temperature differences before and after executing the film forming processing has been evaluated in order to investigate an influence of the film forming processing on the radiation thermometer. In the experimental, a $Ta_2O_5$ (tantalum oxide) film having a total thickness of 2 μm was formed. Also, process temperature was 440° C., 460° C. and 480° C. With respect to each of the process temperatures, process pressures were varied to have four values, i.e., 0.3 torr (40 Pa), 1.0 torr (133 Pa), 2.5 torr (333 Pa) and 5.0 torr (665 Pa).

As shown in FIG. 6, with respect to each of the process temperatures, the temperature difference at 0.3 torr was rather large, reaching about −1.0° C., but it was within an acceptable range. Also, when the process pressures range from 1.0 torr to 5.0 torr in case of "after forming 2μ film ", it has been found that all the temperature differences are within ±0.5° C., which shows an excellent measurement accuracy.

The embodiment described above has been described as having a single light introducing rod 68 installed at the substantially central part of the gas injection surface 18 of the shower head 12. In some processing device, however, the susceptor 26 may be divided into a plurality of heating zones and the temperature of each heating zone can be controlled independently. In such case, the light introducing rod 68 of the radiation thermometer may be installed for each of the heating zones.

Figure 7:
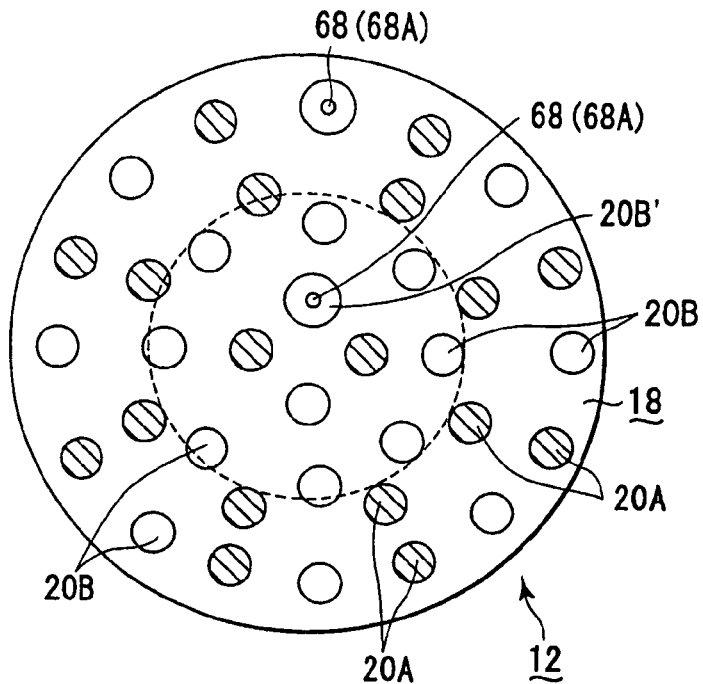
FIG. 7 depicts a shower head structure in accordance with another preferred embodiment of the present invention, which shows an arrangement of light introducing rods with respect to a gas injection surface in case a susceptor is divided into two heating zones, i.e., inner and outer zones.
Figure 8:
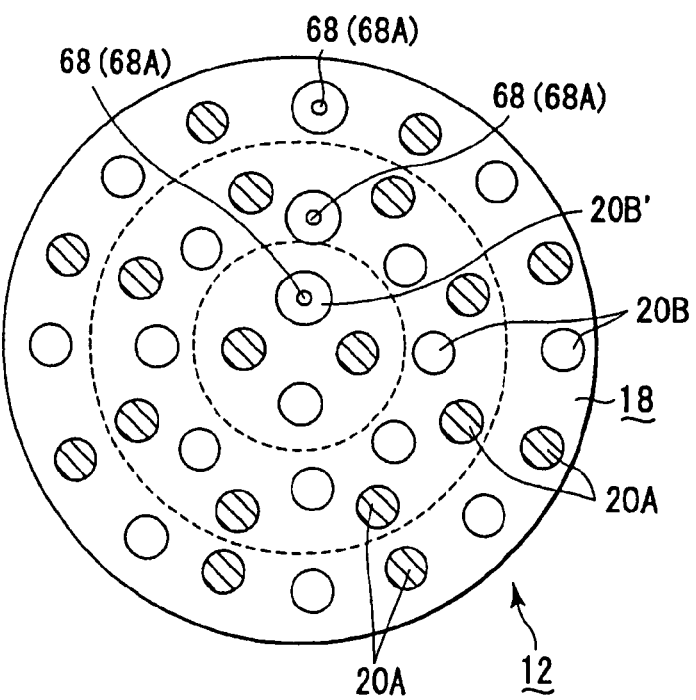
FIG. 8 shows a shower head structure in accordance with a further preferred embodiment of the present invention, which shows an arrangement of light introducing rods with respect to a gas injection surface in case a susceptor is divided into three heating zones, i.e., inner, middle and outer zones.

FIGS. 7 and 8 are schematic views respectively showing gas injection surfaces of shower head structures implemented in light of the above-described aspect in accordance with further preferred embodiments of the present invention.

FIG. 7 illustrates an arrangement of the light introducing rods with respect to the gas injection surface in accordance with an embodiment wherein a susceptor is divided into two heating zones, i.e., inner and outer zones. That is, in this case, the heating zones of the susceptor 26 (see FIG. 1) are divided into the inner and the outer zones of a concentric circular shape. The light introducing rods 68 of the radiation thermometers are installed at the corresponding inner and outer zones of the gas injection surface 18 of the shower head structure. Temperatures at the heating zones of the susceptor are controlled based on detected values of the radiation thermometers respectively.

FIG. 8 shows an arrangement of the light introducing rods in the gas injection surface in accordance with an embodiment wherein a susceptor is divided into three heating zones, i.e., inner, middle and outer zones. In this case, the heating zones of the susceptor 26 (see FIG. 1) are divided into the inner, middle and outer zones of a concentric circular shape. The light introducing rods 68 of the radiation thermometers are installed at the corresponding inner, middle and outer zones of the gas injection surface 18 of the shower head structure. Temperatures at the heating zones of the susceptor are controlled based on detected values of the radiation thermometers respectively.

Further, the configuration of the heating zones is not limited to the above arrangements having the heating zones of the concentric circular shape, and may have any types of arrangements.

During the heat treatment of the wafer W in the above embodiments, the wafer temperature is continuously measured by the radiation thermometer 66, and then the measured value is inputted to the temperature controller 74 in order that the wafer temperature is controlled by performing a feedback control on the heating lamps 52. Alternatively, the heating lamps can be feedback controlled based on a value measured by a thermocouple installed at the susceptor 26 and a setting temperature can be corrected (or compensated) by measuring periodically or non-periodically the wafer temperature by using the radiation thermometer.

Figure 9:
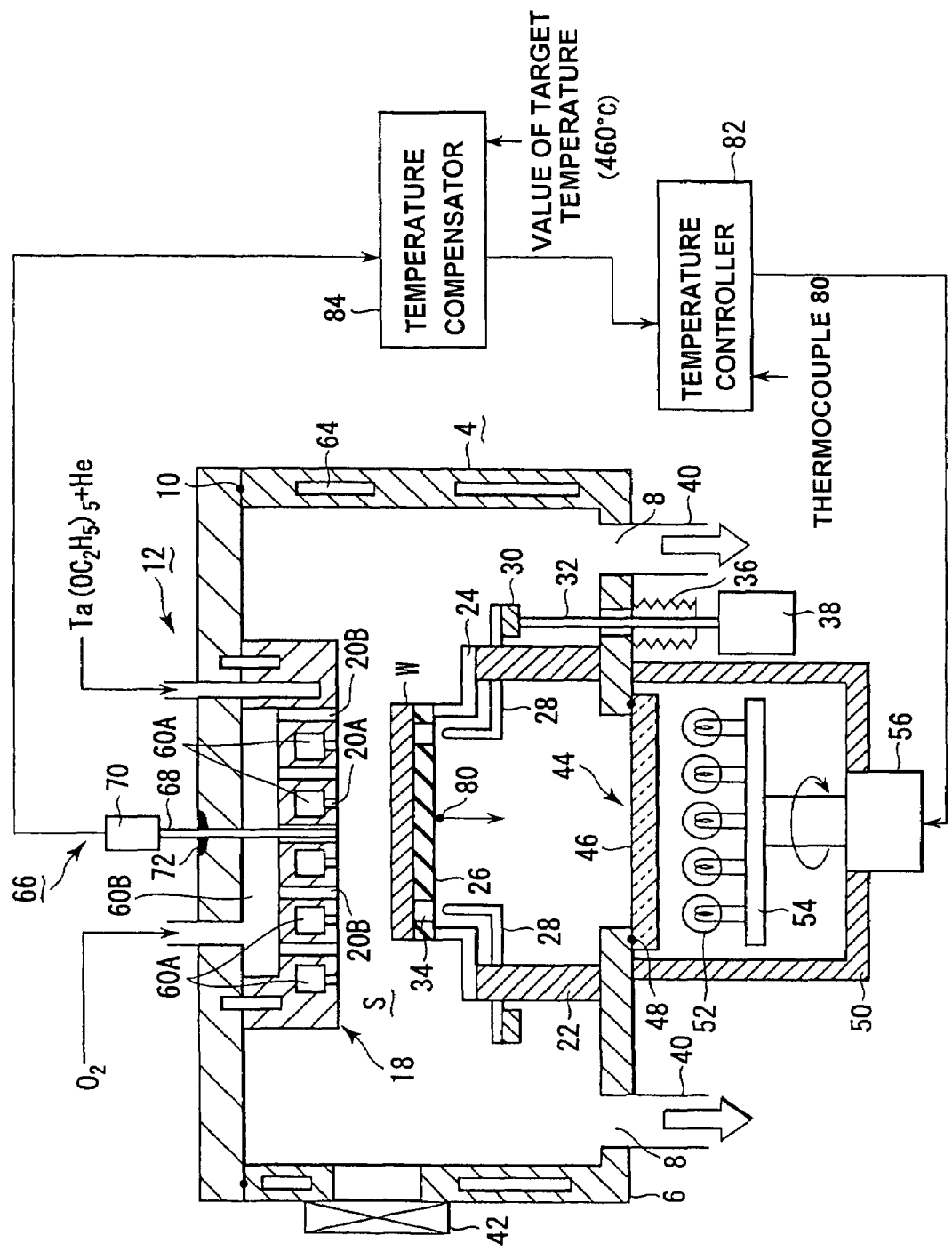
FIG. 9 is a structural diagram of a semiconductor processing device in accordance with another preferred embodiment of the present invention.

FIG. 9 shows a structural diagram of a semiconductor processing device implemented in view of the above-mentioned aspect in accordance with another preferred embodiment of the present invention.

As shown in FIG. 9, a thermocouple 80 is installed as a means for measuring the temperature of the susceptor 26 for example. Values measured by the thermocouple 80 are inputted to a temperature controller 82, and then electric power provided to the heating lamps 52 is controlled based on the measured values, so that the susceptor 26 is maintained at a given setting temperature.

Meanwhile, the value measured by the radiation thermometer 66 installed at the shower head 12 is inputted to a temperature proofreading controller 84. If necessary, the setting temperature of the temperature controller 82 is corrected by the temperature proofreading controller 84 based on the value detected by the radiation thermometer 66 and a target temperature.

In the ensuing discussion, an operation of the device shown in FIG. 9 and a reason for correcting the setting temperature value will be described.

Generally, contact surfaces of the susceptor 26 and the wafer W are not planar microscopically and there exists a rather ununiform gap therebetween. Because such a gap serves as a barrier to heat conduction, the actual temperature of the wafer W becomes lower than that of the susceptor 26 by several degrees, e.g., about 5° C. Therefore, in case of controlling the temperature of the susceptor 26 during the heat treatment process, the setting temperature thereof is determined by adding the above-described temperature difference.

For example, in case of performing the heat treatment with the wafer temperature of 460° C., the setting temperature of the susceptor 26 is determined as 465° C. by adding the above temperature difference, e.g., 5° C.

If the film forming processing is repeated with respect to a certain number of wafers, a thin film also adheres to an inner wall of the processing chamber, so that thermal reflectivity of the inside thereof is varied, e.g., lowered. The lowered thermal reflectivity in turn reduces the amount of energy supplied to the wafer W by thermal reflection and, therefore, the temperature of the wafer W decreases accordingly. In such a case, the setting temperature of the susceptor 26 is compensated for the variation of the amount of energy caused by the thermal reflection.

For example, suppose that, after performing the film forming processing on a number of wafers, the wafer W is not heated sufficiently to a target temperature of 460° C. and is maintained at 457° C., which is 3° C. lower than the target temperature, although the temperature of the susceptor 26 is maintained at 465° C. In the case, the setting temperature of the susceptor 26 is corrected to be set as 468° C. (=465° C.+3° C.) by considering the lowered temperature, i.e., 3° C. By doing so, it becomes possible to maintain the wafer temperature again at 460° C.

In an actual heat treatment process, a certain number of wafers, e.g., a lot of 25 wafers, are continuously heat treated (subjected to a film forming processing) (referred to as a continuous processing operation). During the continuous processing operation, the temperature controller 82 performs a feedback control on the heating lamps 52 by continuously using values measured by the thermocouple 80 that is installed at the susceptor 26, instead of using values detected by the radiation thermometer 66. For example, in order to attain the wafer temperature of 460° C., the setting temperature of the susceptor 26 is set to be 465° C. with the assumption that an initial temperature difference between the susceptor 26 and the wafer W is 5° C.

After a predetermined number of wafers are processed as described above, an operation for correcting temperature is executed. In this process, instead of a product wafer W, a dummy wafer, i.e., a substrate for correcting the temperature is carried into the processing chamber 4. The wafer is processed under a same condition of, e.g., process pressure, process temperature and processing gas used as in processing the product wafer. In this case, the processing gas for forming a film may not be provided thereto. When the dummy wafer for correcting the temperature is thermally processed, the temperature of the dummy wafer is detected and monitored by the radiation thermometer 66 installed at the shower head 12. The detected temperature is inputted to the temperature proofreading controller 84. At the same time, a value measured by the thermocouple 80 is also inputted to the temperature controller 82.

After the process for correcting the temperature is finished, a temperature correcting operation is executed. In this process, the temperature of the susceptor 26 controlled by the temperature controller 82 is corrected based on the target temperature value of the wafer W and the value detected by the radiation thermometer 66. The target temperature value may be prestored or can be provided from the temperature controller 82.

For example, suppose that the wafer temperature is 457° C. (the value detected by the radiation thermometer), which is 3° C. lower than the target temperature value of 460° C. In this case, in the temperature controller 82, a new setting temperature is set to be 468° C. by adding 3° C. to the setting temperature of the susceptor 26. In this way, the setting temperature is changed to 468° C. and then, starting from the following process, the temperature of the susceptor 26 is controlled to be the resetted setting temperature of 468° C. Thus, the wafer temperature is maintained at the target temperature of 460° C.

The above-described continuous processing operation, the operation for correcting temperature and the temperature correcting operation is repeated in that order a predetermined number of times. In this way, the setting temperature of the susceptor can be corrected to a proper value all the time. Further, the processing temperature of the wafer W can be always maintained approximately at the target temperature value during the heat treatment process.

After the sequence of the above operations is repeated a number of times as mentioned above, a large amount of unwanted film causing the generation of foreign materials adheres to the processing chamber 4. Therefore, a cleansing processing for removing the unwanted film is executed by flowing a cleansing gas, e.g., $ClF_3$, $NF_3$, $C_2F_6$, $CF_4$, etc., in the processing chamber 4.

After the cleansing processing, a pre-coating processing for forming a thin film on inner walls of the processing chamber 4 and surfaces of structures therein is executed to adjust a thermal condition in the processing chamber 4. The pre-coating processing is executed by letting the processing gas flow in the processing chamber 4 under the same process conditions as used in the film forming processing but without loading the wafer W in the processing chamber 4.

Since the pre-coating processing changes the reflectivity of inner wall surfaces, and the like, of the processing chamber 4, the operation for correcting temperature and the temperature correcting operation are executed before carrying the product wafer into the processing chamber 4. In this way, the temperature of the susceptor can be controlled to be at a proper value depending on conditions after the cleaning processing.

Further, the number of wafers W to be processed in the continuous process operation is not limited to 25 but may be determined differently based on an amount of a film formed on one wafer.

In the above embodiments, the light introducing rod 68 of the radiation thermometer 66 is fixedly installed. However, the light introducing rod 68 can be installed in such a manner that it can be moved up and down and retreatable from the processing space S when necessary.

Figure 10:
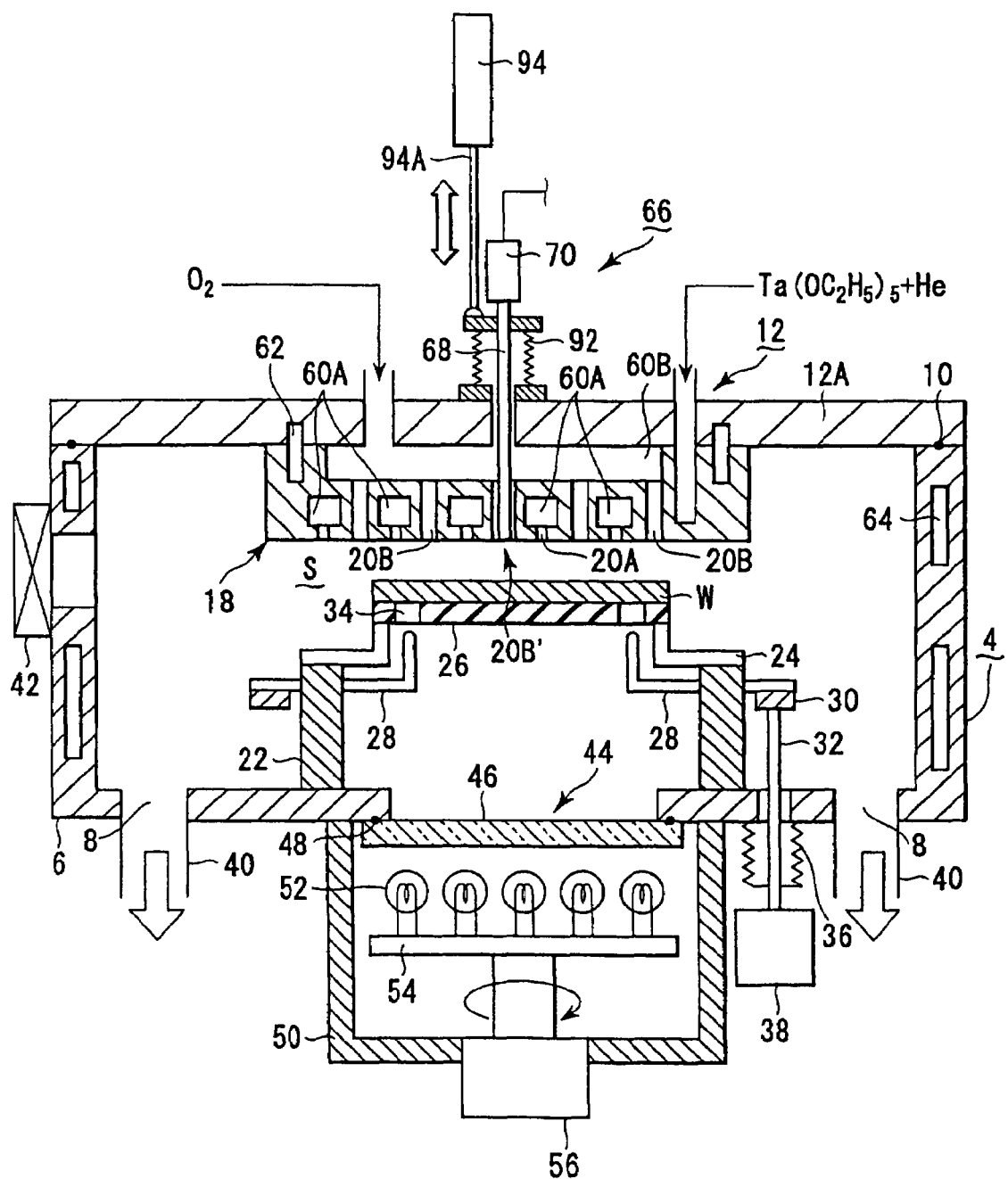
FIG. 10 describes a structural diagram of a semiconductor processing device in accordance with still another embodiment of the present invention.

FIG. 10 describes a structural diagram of a semiconductor processing device implemented in light of the above-described aspect in accordance with still another embodiment of the present invention. FIGS. 11A and 11B are enlarged partial views showing a movement of the light introducing rod in the device shown in FIG. 10;

As shown in FIG. 10, a through hole 90 is formed at a ceiling plate 12A of the shower head 12 in accordance with this embodiment, and further the light introducing rod 68 is inserted therethrough in a free fitting manner, so that it can be freely moved up and down. A bellows 92 made of, e.g., a pleated metal is installed between an upper end part of the light introducing rod 68 and the ceiling plate 12A. The bellows 92 enables the light introducing rod 68 to move up and down while the head space for assist gas 60B being airtightly sealed. The upper end part of the light introducing rod 68 or the bellows 92 is connected to an arm 94A of a rod elevator 94, e.g., implemented by an actuator. The light introducing rod 68 is moved up and down by the rod elevator 94 when necessary.

In this embodiment, e.g., in case of executing the operation for correcting temperature, the light incoming surface 68A is made to face toward the processing space S by lowering the light introducing rod 68 down to the lowest position as shown in FIG. 11A. On the other hand, in case of normal processing (e.g., the film forming processing), continuous processing (e.g., continuous film forming processing) or cleaning processing, the light introducing rod 68 is lifted up as shown in FIG. 11B. In this case, the light introducing rod 68 remains at a certain location where a film does not adhere to the light incoming surface 68A of the loading end thereof or the cleaning gas does not attack the light incoming surface 68A. (In FIG. 11B, the light introducing rod 68 is elevated up to the inside of the head space for assist gas 60B)

In this way, the unwanted film does not adhere to the light incoming surface 68A, and it can be prevented from becoming rugged by the attack of cleaning gas. Therefore, a rate of incident light introduced from the light incoming surface 68A does not change and thus a correction of temperature may be performed with a high reproducibility.

In case of using the light introducing rod 68 during the film forming processing, the light introducing rod 68 is lowered down as shown in FIG. 11A.

Figure 12A:
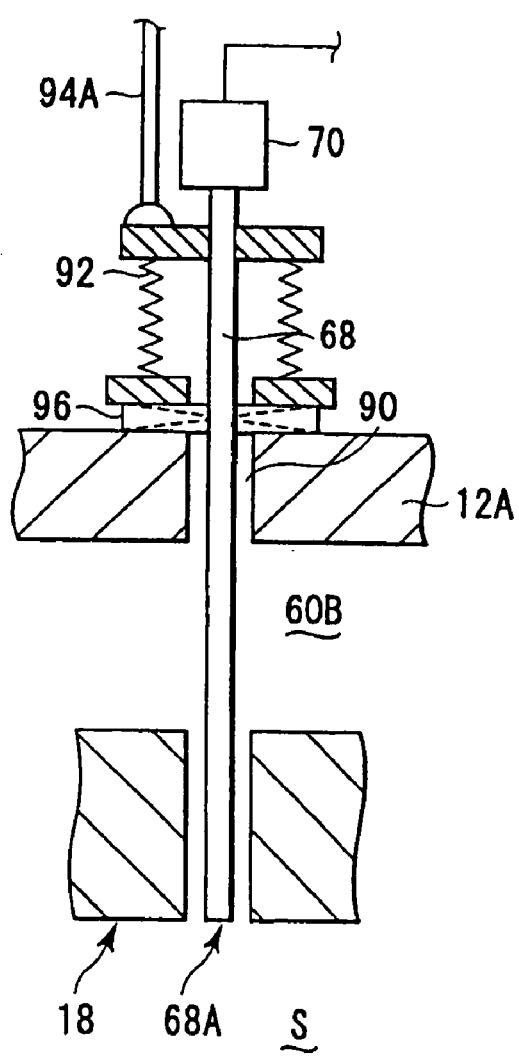
FIGS. 12A and 12B are enlarged partial views, respectively, showing a movement of a light introducing rod in a semiconductor processing device in accordance with further preferred embodiment of the present invention.
Figure 12B:
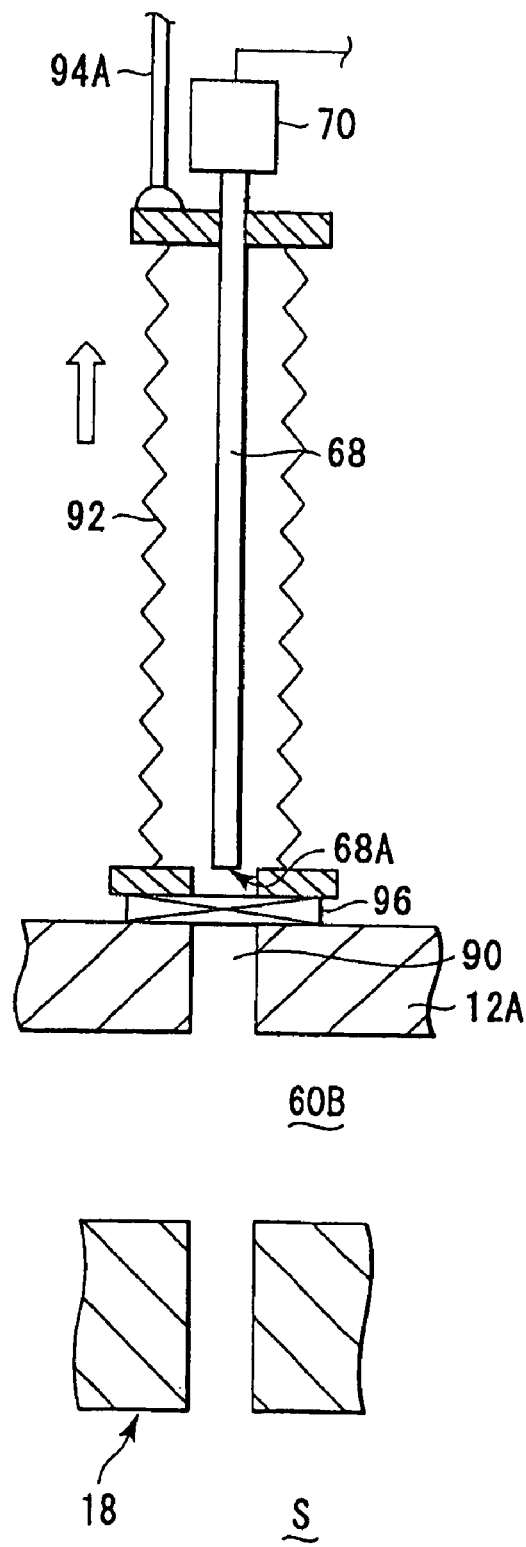

FIGS. 12A and 12B are enlarged partial views, respectively, showing a movement of a light introducing rod in a semiconductor processing device in accordance with further preferred embodiment of the present invention. In the device shown in FIG. 10, there is a possibility that a certain amount of the assist gas may flow into the bellows 92 from the head space for assist gas 60B. The device shown in FIGS. 12A and 12B includes structures for solving such a problem.

As shown in FIGS. 12A and 12B, a small separation valve 96 such as a gate valve is installed on an upper end part of the through hole 90 through which the light introducing rod 68 passes. The separation valve 96 has such a dimension that the light introducing rod 68 may pass therethrough. As shown in FIG. 12B, when the light introducing rod 68 is fully pulled out in an upper direction, the separation valve 96 is closed, so that the inside of the bellows 92 is completely separated from the processing space S. In this way, when the light introducing rod 68 is not used, it is possible to prevent such problems that the unwanted films adhere to the light incoming surface 68A or the surface thereof becomes roughed due to the cleaning gas. Moreover, the assist gas can be prevented from getting into the interior of the extended bellows 92.

Though the heating lamps 52 are employed as heating a means in each of the above-described embodiments, a resistance heater embedded in the susceptor may be used in lieu thereof. The embodiments may be applied not only to a film forming processing but also to a processing where a thin film may adhere to the light introducing rod, e.g., a plasma etching processing performed by an etching processing device. In this case, the above-mentioned light introducing rod may be installed in an injection hole for injecting an etching gas in a shower head structure.

In each of the embodiments, the susceptor 26 is sustained by the three support members 24, each being of an L-shaped rod formed of quartz. In this case, heat rays radiated from the heating lamps 52 can be scatteredly reflected below the susceptor 26 and then get into the processing space S through a gap between an upper end part of the reflector 22 and an outer circumference of the susceptor 26. Moreover, thus introduced heat rays may be scatteredly reflected in the processing space S to finally go into the light introducing rod 68. In such an instance, the wafer temperature measured by the radiation thermometer 66 may become much higher than the actual wafer temperature, so that temperature detection accuracy may be deteriorated.

A certain prior art device employs a susceptor made of a ring-shaped transparent quartz instead of the support members 24. In this case, the above-described problems may still prevail since the scatteredly reflected heat rays get into the processing space S via the transparent quartz as well.

Figure 13:
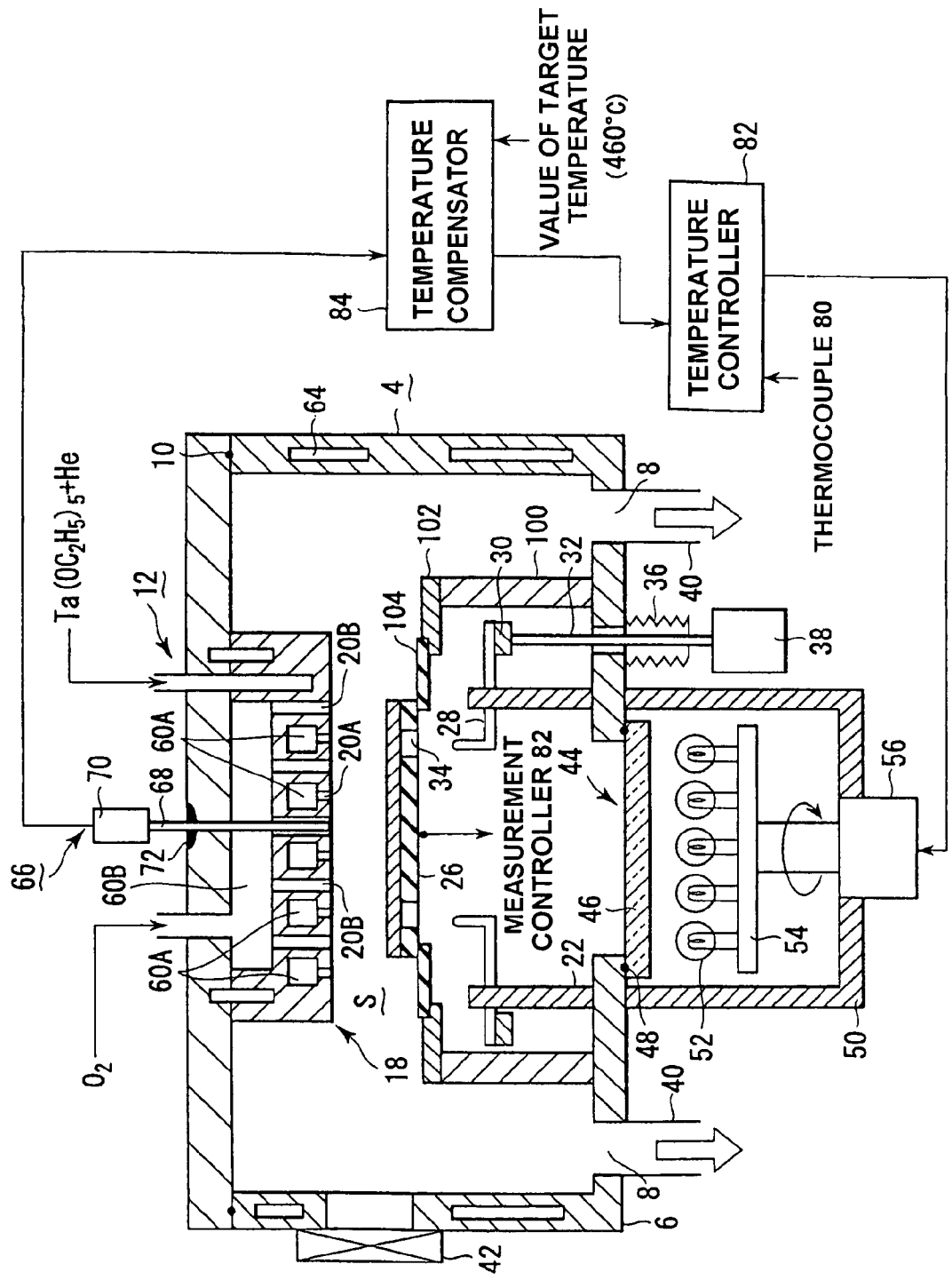
FIG. 13 exhibits a structural diagram of a semiconductor processing device in accordance with still another preferred embodiment of the present invention.

FIG. 13 exhibits a structural diagram of a semiconductor processing device implemented in light of the above aspect in accordance with still another preferred embodiment of the present invention. That is, the device shown in FIG. 13 has a structure for avoiding an adverse effect due to the scattered reflection of heat rays.

A support structure for the susceptor 26 employed in the device shown in FIG. 13 is quite different from that used in each of the above embodiments. Namely, standing below the susceptor 26 is, e.g., a cylindrical reflector 22 having a mirror-like inside surface. Heat rays radiated from the heating lamps 52 below are reflected to the susceptor 26 by the reflector 22. Similarly, a cylindrical support barrel 100 made of e.g., aluminum, is installed around the outer circumference of the reflector 22, the support barrel 100 and the reflector being arranged concnetrically.

Fixedly mounted on an upper end part of the support barrel 100 is an attachment 102, e.g., having a shape of a circular ring made of aluminum. Further, at an inner circumference of the attachment 102, a support member 104 having a circular ring shape is installed to have a smaller radius than that of the attachment. The support member 104 is formed of a colored material, having a low thermal conductivity, for efficiently blocking the heat rays radiated from the heating lamps 52. An inner peripheral part of the support member 104 supports the susceptor 26 by directly contacting to a peripheral part of the susceptor 26 made of SiC for example.

In order to prevent a temperature drop in the susceptor 26, it is preferable that the support member 104 is of a material having a low thermal conductivity and non-permeability to the heat rays. Specifically, any one of black ceramics, e.g., quartz containing black metal oxide such as niobium oxide, quartz containing black SiC, quartz containing carbon, black AlN containing carbon, and the like, may be used as the material of the support member 104.

In the device as shown in FIG. 13, even in the case where the heat rays radiated from the heating lamps 52 toward a place other than the bottom of the susceptor 26 is scatteredly reflected in a space below the susceptor 26, the scatteredly reflected light is finally absorbed by the bottom of the susceptor 26 or the support member 104, e.g., colored with black. Therefore, the scatteredly reflected light can be prevented from getting into the processing space S above the susceptor 26 and then propagating into the light introducing rod 68 of the radiation thermometer 66. In this way, the wafer temperature can be measured more accurately by the radiation thermometer 66.

Figure 14:
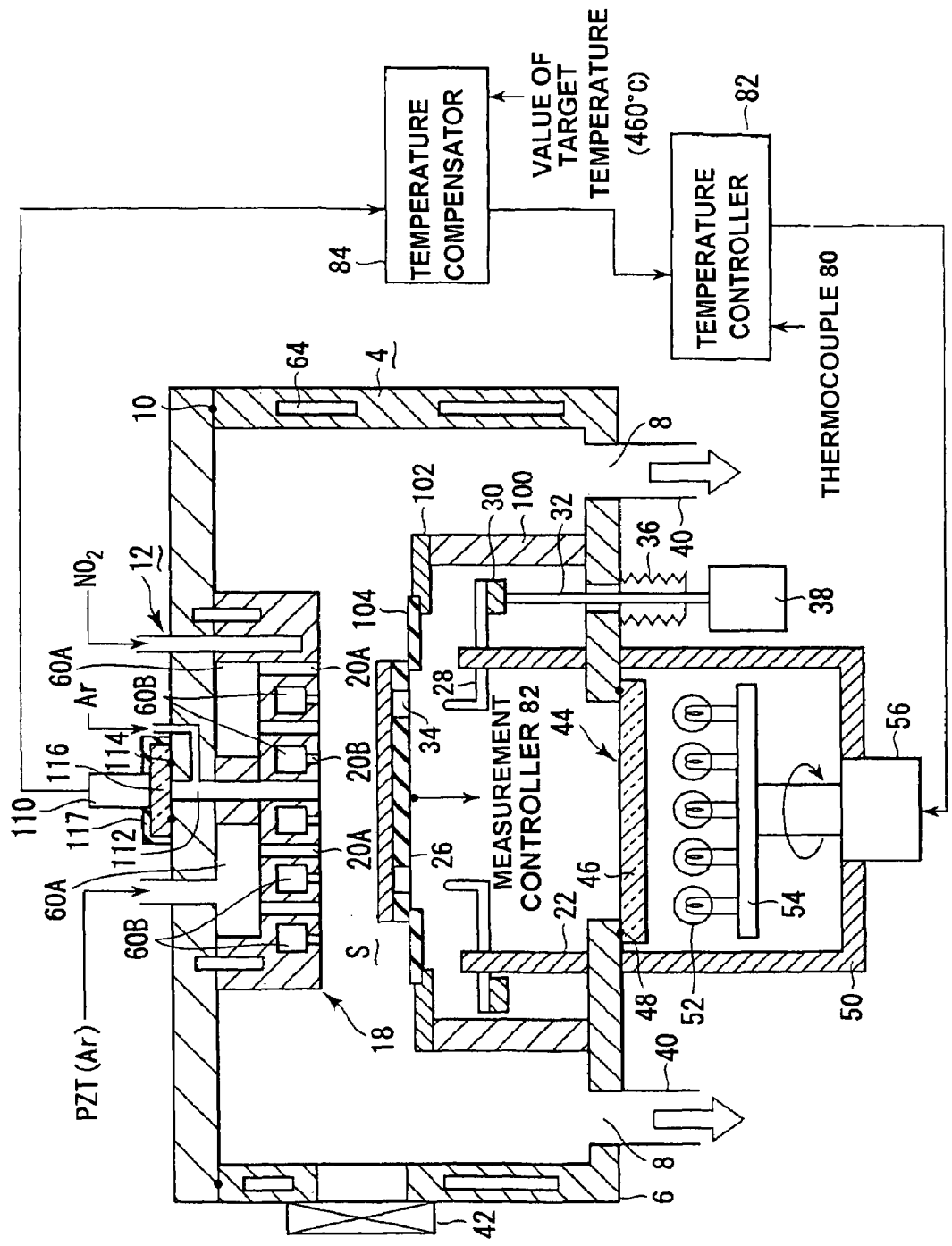
FIG. 14 provides a structural diagram of a semiconductor processing device in accordance with still another preferred embodiment of the present invention.

FIG. 14 provides a structural diagram of a semiconductor processing device in accordance with still another preferred embodiment of the present invention. In this embodiment, instead of a tantalum oxide film, a thin film made of a complex metallic material, i.e., a PZT film (an oxide film of Pb, Zr and Ti) is exemplified in the film forming processing.

In the device shown in FIG. 14, the susceptor 26 is supported by the inner peripheral part of the support member 104, which has a low thermal conductivity and is non-permeable to heat rays, of, e.g., a black circular ring shape as described with respect to the device in FIG. 13. The support member 104 is arranged on the attachment 102, having a ring shape, fixed on the support barrel 100.

In this embodiment, the radiation thermometer 110 of a type not having the light introducing rod 68 (see FIGS. 9 and 13) is used as the radiation thermometer attached to the shower head 12. Namely, a heat ray introducing passage 112, e.g., with a diameter of approximately 13 mm, is formed for it to vertically pass through around a substantially central part of the shower head 12. The heat ray introducing passage 112 is separated from the head space for source gas 60A and the head space for assist gas 60B.

A measurement window 116 made of, e.g., quartz glass is airtightly attached to an upper opening part of the heat ray introducing passage 112 through a sealing member 114 such as an O ring. The radiation thermometer 110 is attached to the outside of the measurement window 116. In order to block the light from the outside of the processing chamber 4, a part of the measurement window 116 and the radiation thermometer 110 is covered by a cover 117 made of an opaque material, e.g., polyimides (of heat resistance). The radiation thermometer 110 measures temperature by sensing the heat rays radiated from the surface of the wafer W through the heat ray introducing passage 112. The heat ray introducing passage 112 collects the light within a range of up to 45° C. from the leading end of the heat ray introducing passage 112.

In a vicinity of the region directly below the measurement window 116, an inert gas introducing passage 118 branches from the heat ray introducing passage 112. A small amount of inert gas, e.g., Ar gas, continuously flows through the inert gas introducing passage 118. Therefore, an unwanted film disturbing the temperature measurement is prevented from adhering to an inner surface of the measurement window 116.

Further, in the device shown in FIG. 14, the PZT gas is introduced to an upper space in the shower head 12, and an oxidizing gas, e.g., $NO_2$ gas, is introduced to a lower space therein. Accordingly, the upper space and the lower space become the head space for source gas 60A and the head space for assist gas 60B, respectively, which is an opposite case to the above-described embodiments. In FIG. 14, therefore, the reference numerals indicating the gas injection holes 20A and 20B are designated inversely to the cases in the above embodiments.

In the device shown in FIG. 14, a PZT gas, generated by vaporizing a liquid source material by way of a vaporizer, is introduced to the head space for source gas 60A of the shower head 12. In this case, an inert gas, e.g., Ar gas, is used as a carrier gas in the vaporizer. On the other hand, an oxidizing gas, e.g., $NO_2$ gas, is provided to the head space for assist gas 60B. Both of the gases are mixed and react with each other in the processing space S, so that a PZT film is deposited on the wafer W.

During the film forming processing, the temperature of the wafer W is measured by the radiation thermometer 110 detecting the heat rays propagating through the heat ray introducing passage 112 installed in the shower head 12. Since a small amount of Ar gas is continuously provided to the heat ray introducing passage 112 through the inert gas introducing passage 118, an unwanted film can be prevented from adhering to the inner surface of the measurement window 116. At this time, a flow rate of Ar gas for purge is, e.g., about 2 to 3 sccm, which is much lower than about 300 sccm of the carrier gas of PZT gas.

In the same manner as described with respect to the device shown in FIG. 13, even in the case where the heat rays, radiated from the heating lamps 52 toward a place other than the bottom of the susceptor 26, are scatteredly reflected in a space below the susceptor 26, the scatteredly reflected light is finally absorbed by the bottom of the susceptor 26 or the support member 104, e.g., colored with black. Therefore, the scatteredly reflected light can be prevented from leaking into the processing space S above the susceptor 26 and then getting into the radiation thermometer 110. In this way, the wafer temperature can be measured more accurately by the radiation thermometer 110.

Moreover, instead of the Ar gas, another inert gas, e.g., He gas, Ne gas, $N_2$ gas, and the like, may be used as the above-described inert gas for purge and carrier gas. Further, a source gas required for forming a film may be introduced to the heat ray introducing passage 112 through an introduction passage. The source gas herein is preferably a gas that does not render the unwanted film disturbing the temperature measurement to adhere to the measurement window. The present embodiment may also be applied to forming a film, other than the PZT film, containing another complex metallic material, e.g., a BST film (oxide film of Ba, Sr and Ti).

Figures 15, 17:
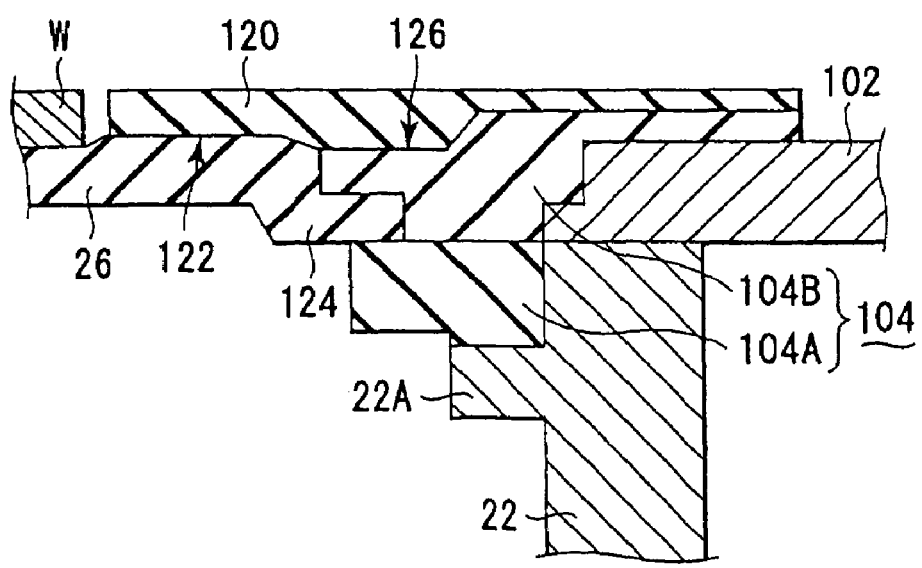
FIG. 15 tabulates detection values from a radiation thermometer and a thermocouple of the device shown in FIG. 14.
FIG. 17 is an enlarged cross sectional view illustrating a peripheral zone around a susceptor of the device shown in FIG. 16.

An evaluation of the measurement values of the radiation thermometer 110 was carried out with respect to the device shown in FIG. 14. The results of the evaluation will be described hereinafter. FIG. 15 is a table comparing detection values from a radiation thermometer with those from a thermocouple installed in the device shown in FIG. 14.

In the evaluation, the wafer temperature was measured by attaching the thermocouple to the surface of the wafer. In any case, the value of the wafer temperature measured by the thermocouple was about 433° C. In case where the support member 104 supporting the susceptor 26 was formed by employing transparent quartz glass as used in the prior art structure, the values measured by the radiation thermometer 110 were about 40° C. higher than the values measured by the thermocouple, i.e., about 433° C. and were not stable. On the other hand, in case where the support member 104 was formed by employing black quartz glass, the values measured by the radiation thermometer 110 were only about 2° C. higher at the maximum than the values measured by the thermocouple, i.e., about 433° C., as shown in FIG. 15 tabulating the results of eight measurements. That is, it has been found that a measurement accuracy of the wafer temperature can be greatly improved by employing the support member 104 made of the black quartz glass.

Figure 16:
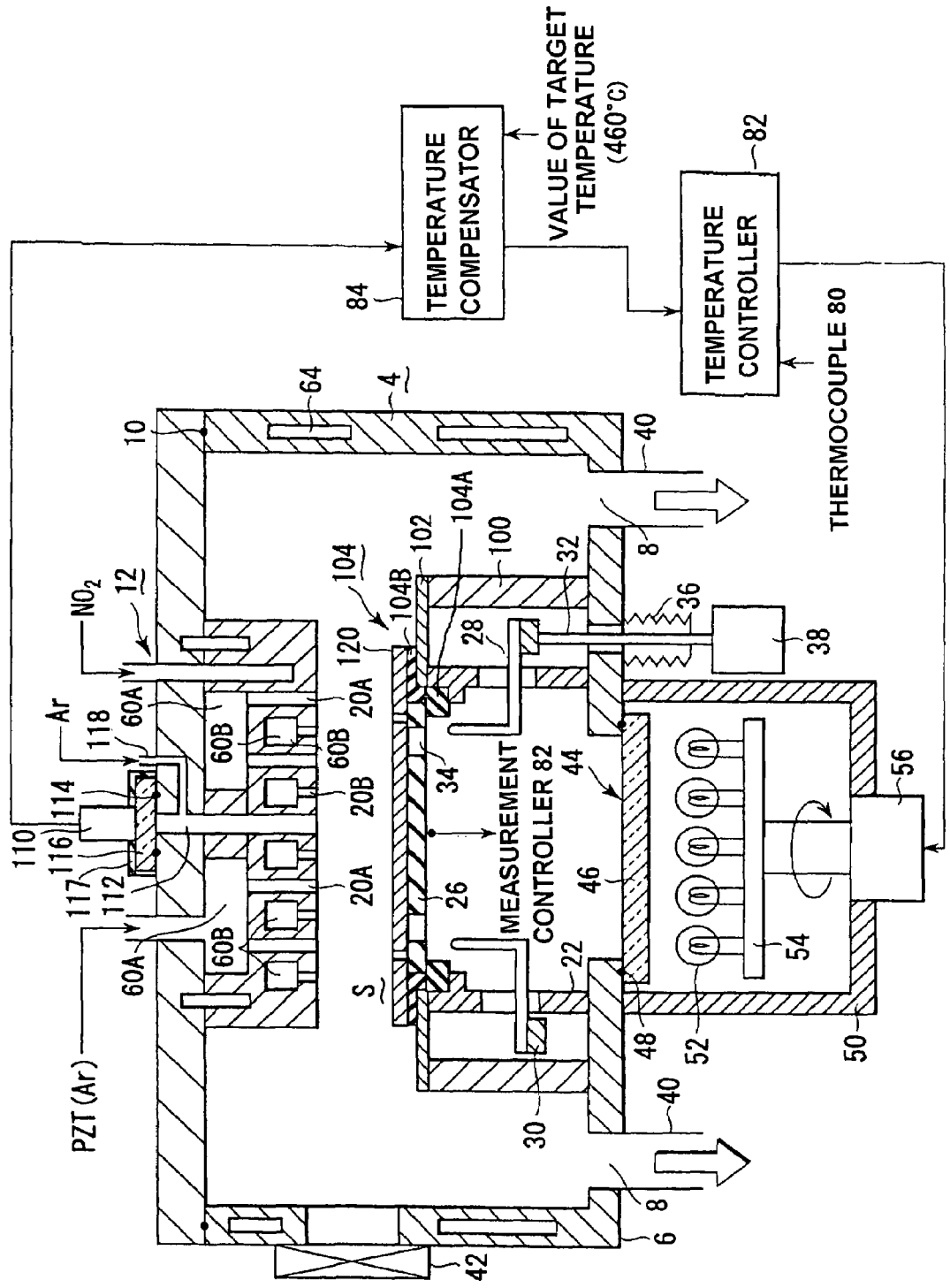
FIG. 16 describes a structural diagram of a semiconductor processing device in accordance with still another preferred embodiment of the present invention.

FIG. 16 describes a structural diagram of a semiconductor processing device in accordance with still another preferred embodiment of the present invention. FIG. 17 is an enlarged cross sectional view illustrating a peripheral zone around a susceptor of the device shown in FIG. 16.

In the device shown in FIG. 16, an attachment 102 is installed between an upper part of a cylindrical reflector 22 and an upper part of a support barrel 100. As shown in FIG. 17, on a projected portion 22A formed at an upper part of the reflector 22, the susceptor 26 is supported through a support member 104. On an upper surface of the support member 104, an isolation ring 120 blocking heat rays is installed.

In particular, on the upper surface of a peripheral portion of the susceptor 26 as shown in FIG. 17, an annular projection portion 122 is installed in a manner of surrounding the periphery of the wafer W in order to suppress thermal radiation from a peripheral region of a wafer W. Further, at the peripheral portion of the susceptor 26, a flange 124 supported by the support member 104 is installed. The support member 104 includes a lower component 104A and an upper component 104B joined thereon. Between the upper and the lower component 104B and 104A, the flange 124 is supported as being inserted.

The lower component (referred to as a base ring) 104A functions as a base for deciding a location of the susceptor 26 in the vertical direction. The upper component (referred to as an isolation ring) 104B serves to determine a location of the susceptor 26 in the horizontal direction and also functions to press the susceptor 26 downwards to prevent the susceptor 26 from flying or moving, e.g., during an initial rough pumping stage when the processing chamber 4 is decompressed.

It is preferable that the upper and the lower component 104B and 104A are made of a material, e.g., alumina ($Al_2O_3$), having heat resistance, noncontamination property with respect to the wafer W and low thermal conductivity. Instead of the alumina, e.g., any one of silicon carbide, silicon oxide ($SiO_2$) or quartz may be used as the material of the upper and the lower component 104B and 104A. Moreover, as in the support member 104 shown in FIG. 13, a material with non-permeability to heat rays, e.g., any one of black ceramics, e.g., quartz containing black metal oxide such as niobium oxide, quartz containing black SiC, quartz containing carbon, black AlN containing carbon, and the like, may be used as the material of the upper and the lower component 104B and 104A.

The isolation ring 120 is installed to cover an entire upper surface of the upper component 104B and a substantially entire upper surface of the projection portion 122 of the susceptor 26. The heat ray from the lower part of the susceptor 26 to the upper part thereof through the support member 104 can be maximally blocked by the isolation ring 120.

A thickness of the isolation ring 120 is set to be, e.g., about 1.5 mm. At a part of lower surface of the isolation ring 120, a ring-shaped projection portion 126 is formed for position locking by being fitted to stepped portion on an upper surface of the upper component 104B. The isolation ring 120 is installed at least to cover the entire upper surface of the upper part 104B. In terms of blocking effect of heat rays, it is preferable that an inner periphery of the isolation ring 120 is placed as close as possible to an outer periphery of the wafer W.

Any one of black ceramics, e.g., quartz containing a black metal oxide such as niobium oxide, quartz containing black SiC, quartz containing carbon, black AlN containing carbon, and the like, may be used as a material of the isolation ring 120. In particular, in case of using the AlN as the material of the isolation ring 120, an amount of contained carbon is above about 1060 ppm.

In the device shown in FIG. 16, the scatteredly reflected light (including heat rays) emitted from the space below the susceptor 26 can be prevented from escaping into the processing space S over the susceptor 26 and then getting into the radiation thermometer 110. In this way, the wafer temperature can be measured more accurately by the radiation thermometer 110. Particularly, in case at least one of the lower and the upper component 104A and 104B is made of a material having non-permeability to heat rays mentioned above, the blocking effect of heat rays can be further enhanced.

Further, in the devices shown in FIGS. 13 to 16, the support member 104 and the isolation ring 120 made of the material having non-permeability to heat rays, needless to say, also block visible rays.

Figure 18:
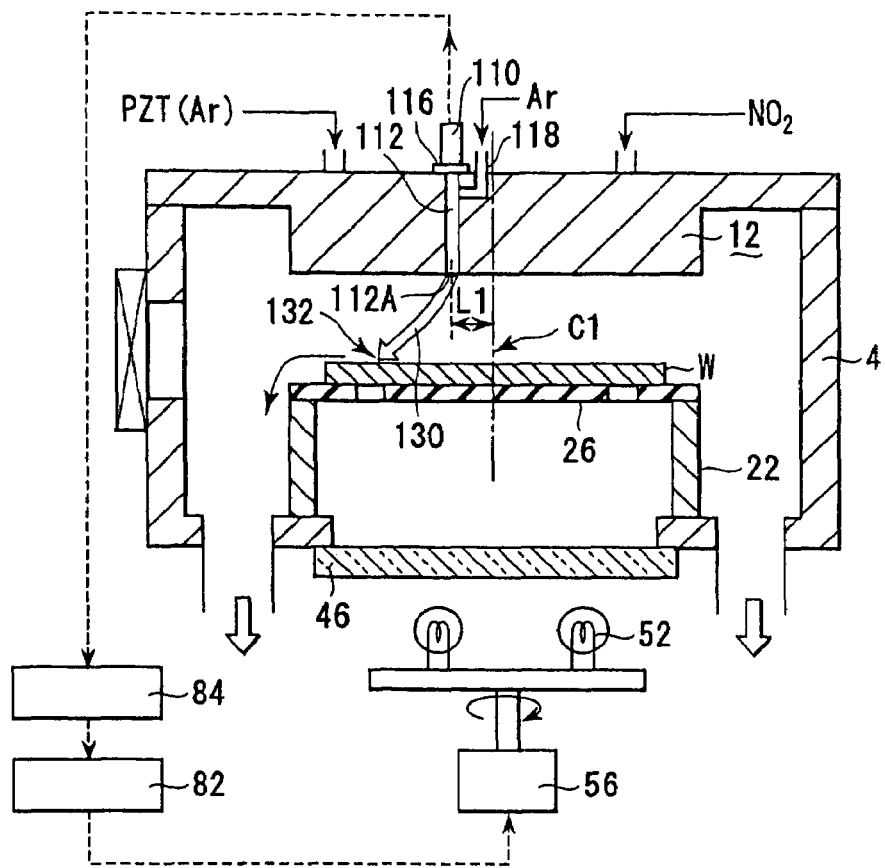
FIG. 18 illustrates a structural diagram of a semiconductor processing device in accordance with still preferred another embodiment of the present invention.
Figure 19:
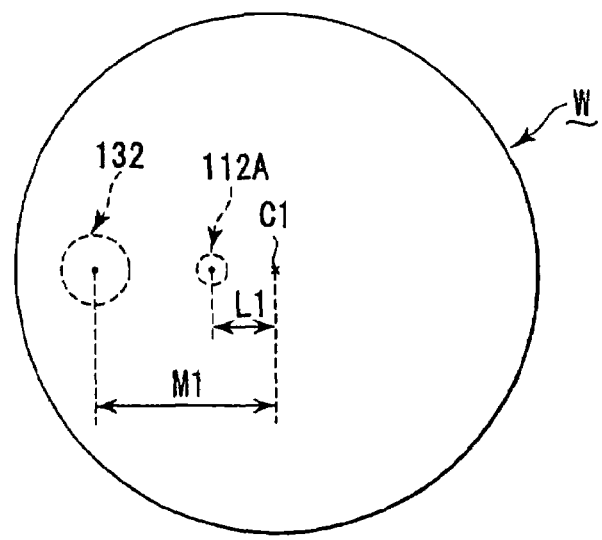
FIG. 19 shows a schematic view of a surface of a semiconductor wafer after forming a film by using the device shown in FIG. 18.
Figure 20:
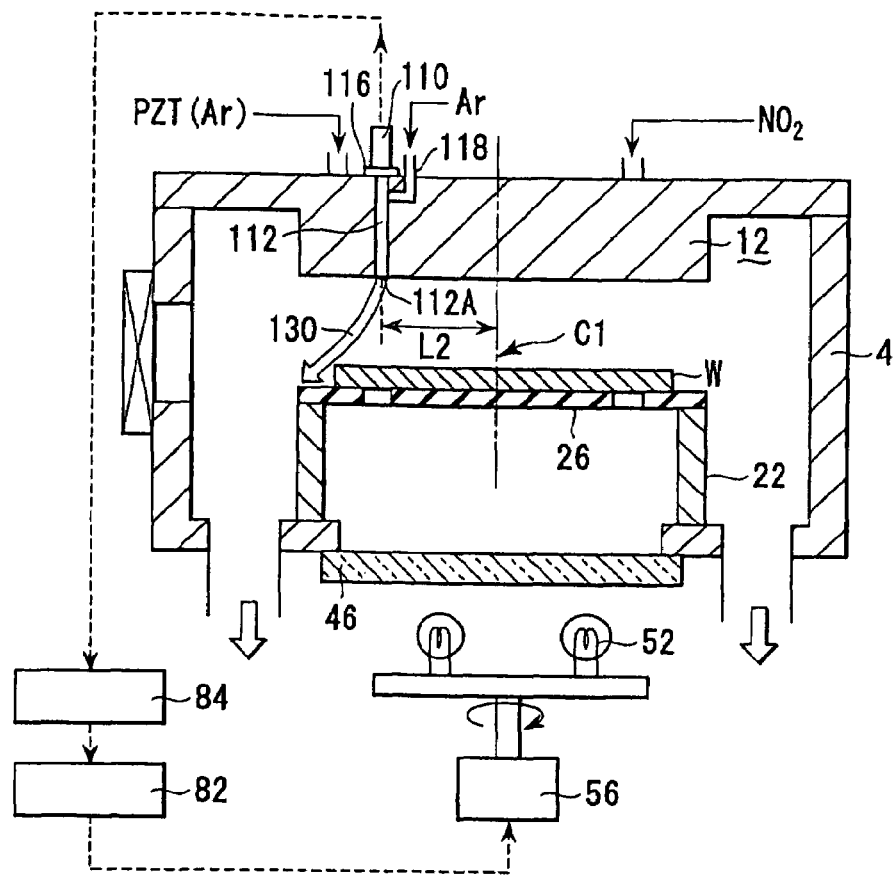
FIG. 20 shows a structural diagram of a semiconductor processing device in accordance with still another preferred embodiment of the present invention.
Figure 21:
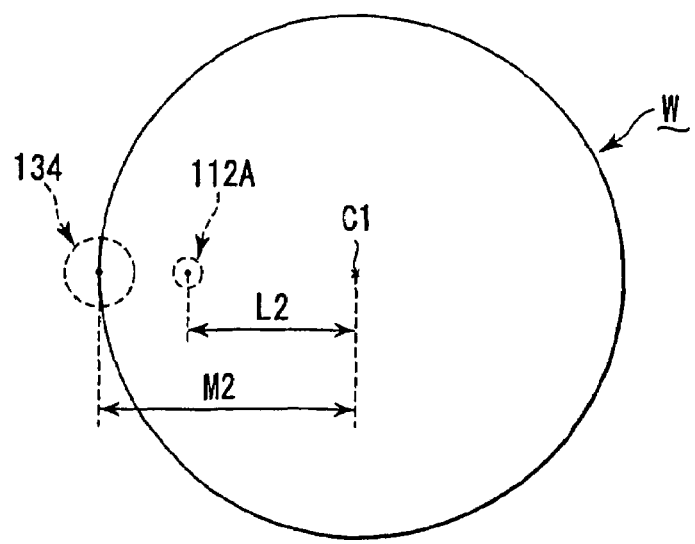
FIG. 21 presents a schematic view of a surface of a semiconductor wafer after forming a film by using the device shown in FIG. 20.

FIG. 18 illustrates a structural diagram of a semiconductor processing device in accordance with still another preferred embodiment of the present invention. FIG. 19 shows a schematic view of a surface of a semiconductor wafer after forming a film by using the device shown in FIG. 18. FIG. 20 shows a structural diagram of a semiconductor processing device in accordance with still another preferred embodiment of the present invention. FIG. 21 presents a schematic view of a surface of a semiconductor wafer after forming a film by using the device shown in FIG. 20. Because the devices shown in FIGS. 18 and 20 are structured based on the device as shown in FIG. 16, certain details thereof are omitted in the drawing.

In each of the devices as shown in FIGS. 13, 14 and 16, the heat ray introducing passage 112 is installed to make it vertically pass through an approximately central part of the shower head 12. The temperature of an approximately central part of the wafer W is measured by using the radiation thermometer 110 installed on the heat ray introducing passage 112.

The central part of the wafer W often becomes a singular thermal point, although it may vary depending on a heating method of the wafer W. In other words, a certain temperature difference may occur between the central part and the rest part of the wafer W. Therefore, it is not preferable that the temperature of the wafer W is determined by measuring the temperature at the central part of the wafer W.

In the device shown in FIG. 18, the heat ray introducing passage 112 and the radiation thermometer 110 are installed at an eccentric location spaced apart from a center line C1 by a certain distance L1, wherein the center line C1 represents a center of the shower head 12 (identical to a center line of the wafer W). In this way, the temperature detection at a singular point of the wafer can be avoided.

In order to prevent a film from being adhered to the inner surface of the measurement window 116, an inert gas, e.g., Ar gas, is introduced through the inert gas introducing passage 118, and then discharged downward from a lower end opening 112A of the heat ray introducing passage 112. Because the vacuum evacuation is carried out uniformly around the outer circumferential part of the susceptor 26, the Ar gas is diffused while the gas is falling toward the outside of the susceptor 16. As shown in FIG. 19, in case an eccentric distance L1 is set to be only several centimeters, a main gas stream 130 of the Ar gas directly falls on a partial area 132 on the surface of the wafer W. It was found that due to the above a thickness of the deposited film in the circular area 132 having a diameter of several centimeters becomes thinner than that in the remaining area on the surface of the wafer W. A projected location of the lower end opening 112A of the heat ray introducing passage 112 is also depicted for reference in FIG. 19.

In case the wafer is 8 inches in size and the eccentric distance L1 is about 4.2 cm, a distance M1 from the center of the wafer to a center of the area 132 is about 6.0 cm, although it may vary depending on the flow rate of the Ar gas and the gap size between the lower surface of the shower head 12 and the upper surface of the susceptor 26. In this case, a diameter of the heat ray introducing passage 112 is about 1.3 cm and a diameter of the area 132 is about 3.0 cm.

In contrast thereto, the lower end opening 112A of the heat ray introducing passage 112 in the devices shown in FIGS. 20 and 21 is installed in such a manner that the major portion of the main gas stream 130 of the Ar gas (inert gas), which is discharged therefrom and is diffused while the gas is falling toward the outside of the susceptor 26, does not directly fall on the surface of the wafer W. In other words, an eccentric distance L2 between the center line C1 of the shower head 12 and the center of the lower end opening 112A of the heat ray introducing passage 112 is set to be greater than the above-described distance L1. In this case, the distance L2 is determined in such a manner that an approximately center of the main gas stream 130 when the main gas stream 130 falls on a horizontal level equal to that of the upper surface of the susceptor 26 is located at an outside of an outer circumference of the semiconductor wafer W mounted on the susceptor 26.

FIG. 21 illustrates the main gas stream 130 falling on an area 134 depicted by a dashed line around the outer circumferential part of the wafer W as described above. In this example, the approximate center of the area 134 is drawn to be located at an outer end of the wafer W, because the area 134 is only to be required not to be in contact with semiconductor devices (area for forming devices). In this case, a distance M2 between the center of the wafer W and the center of the area 134 is a radius of the wafer, i.e., 10.0 cm. Because the radiation thermometer 110 cannot measure the temperature thereof without facing toward the surface of the wafer, the maximum value of the eccentric distance L2 equals to the wafer radius.

In the device shown in FIG. 20, because the main gas stream 130 of the inert gas (Ar gas) does not directly fall on the surface of the wafer, local thinning of a film can be prevented from occurring on the surface of the wafer. More specifically, by setting the eccentric distance L2 as about 8.0 cm, a satisfactory result can be obtained in that the area 132 having a locally thinned film does not exist. In case the radius of the wafer W is 10 cm (8 inch size), it is preferable that the eccentric distance L2 is set to range from 70% to 100% of the radius of the wafer W. The above can be formulated by $M1/L1=M2/L2$. Therefore, $6.0/4.2$ is equal to $10/L2$, so that a distance of L2 becomes 7.0 cm. That is, it is preferable that the distance of L2 ranges from 7.0 cm to 10.0 cm.

Process conditions for the above are as follows. A flow rate of the inert gas (Ar gas) for purge is in a range from 3 sccm to 100 sccm, e.g., 9 sccm. The distance between the lower surface of the shower head 12 and the upper surface of susceptor 26 is in a range from 20 mm to 30 mm, e.g., 25 mm. A pressure in the processing chamber 4 is about 133 pa, and a total flow rate of the source gas is about 500 sccm.

This embodiment may be applied not only to the wafer of 8 inch size but also to a wafer of 12 inch size (300 mm in diameter). Further, the embodiments as shown in FIGS. 18 to 21 may be applied not only to the device using the heating lamps as the heating means but also to a type of device including the resistance heater within the susceptor 26.

Moreover, although a process of forming tantalum oxide film or the PZT film has been exemplified in the above embodiments, the present invention can be equally applied to a process of forming another type of film. For example, the invention can also be applied to processes of forming a tungsten film by thermal CVD by using WFe gas and $H_2$ gas, a TiN film by thermal CVD by using $TiCl_4$ gas and $NH_3$ gas, a Ti film by plasma CVD by using $TiCl_4$ gas and $H_2$ gas and so on. In such cases, the light introducing rod of the radiation thermometer is installed in the gas injection hole of the assist gas, i.e., a reducing gas such as $H_2$ gas or $NH_3$ gas.

Further, the present invention may also be applied to a process using another inert gas, such as He gas, Ne gas or $N_2$ gas or the like, in lieu of Ar gas. And the present invention may also be applied to an etching process for forming a pattern on a substrate to be processed by way of employing a plurality of gas species. Further, instead of the semiconductor wafer as the substrate to be processed, the present invention may also be applied to processes using other types of substrate such as LCD substrate, glass substrate, and the like.

What is claimed is:

1. A semiconductor processing device for processing a semiconductor while providing a first gas and a second gas into a processing space accommodating a heated substrate to be processed, comprising:

a processing chamber forming the processing space and capable of being pumped in vacuum;

a susceptor for mounting the substrate in the processing chamber;

a heater for heating the substrate on the susceptor;

a shower head including a plurality of gas injection holes and a first head space and a second head space formed therein, the shower head being installed at a ceiling of the processing chamber, wherein the first head space is separated from the second head space, and the gas injection holes include first gas injection holes and second gas injection holes to which the first and the second gas are respectively introduced through the first and the second head space;

a heat ray introducing passage formed through the shower head and separated from the first and the second head space formed inside the shower head;

a radiation thermometer facing through a measurement window at an upper opening part of the heat ray introducing passage; and a gas introducing passage formed inside the shower head and connected to the heat ray introducing passage to introduce an additional gas thereinto, the gas introducing passage being separated from the first and the second head space formed inside the shower head and the additional gas being introduced into the processing space through the heat ray introducing passage, wherein the additional gas, the first gas, and the second gas are different from each other.

2. The device of claim 1, wherein the additional gas is discharged from a lower end opening of the heat ray introducing passage to be diffused while the additional gas is falling toward outside of the susceptor; and the heat ray introducing passage is spaced apart from a center of the shower head such that a position of a main gas stream of the additional gas discharged therefrom falls outside an outer circumference of the substrate on the susceptor when the gas stream reaches an identical horizontal level to that of an upper surface of the susceptor.

3. The device of claim 1, wherein a distance between a center of the shower head and a center of the upper opening part of the heat ray introducing passage is set to range from 70% to 100% of a radius of the substrate.

4. The device of claim 1, wherein a distance between a lower surface of the shower head and an upper surface of the susceptor is in a range from 20 mm to 30 mm, and a flow rate of the gas introduced through the heat ray introducing passage is in a range from 3 sccm to 100 sccm.

5. The device of claim 1, further comprising a support member having a ring shape, wherein the support member has a low thermal conductivity, blocks heat rays emitted from the heater and supports the susceptor by contacting a peripheral part thereof.

6. The device of claim 1, further comprising an isolation ring, installed on an upper side of a peripheral part of the susceptor, for blocking heat rays.

7. The device of claim 1, wherein the heat ray introducing passage is separated from the first and the second head space formed inside the shower head such that the additional gas, the first gas, and the second gas are supplied to the processing space from the shower head without being mixed.

8. The device of claim 1, wherein the radiation thermometer is attached to the shower head.

9. The device of claim 1, wherein a gas species constituting the additional gas is different from that of the first and the second gas.

10. The device of claim 9, wherein the heat ray introducing passage is separated from the first and the second head space formed inside the shower head such that the additional gas, the first gas and the second gas are supplied to the processing space from the shower head without being mixed.

11. The device of claim 1, wherein the additional gas flowing through the heat ray introducing passage prevents an unwanted film from adhering to an inner surface of the measurement window.

* * * * *